United States Patent
Taguchi et al.

[11] Patent Number: 5,858,087
[45] Date of Patent: Jan. 12, 1999

[54] SINGLE CRYSTAL PULLING APPARATUS

[75] Inventors: Hiroaki Taguchi; Takashi Atami; Hisashi Furuya, all of Tokyo; Michio Kida, Omiya, all of Japan

[73] Assignees: Mitsubishi Materials Silicon Corp.; Mitsubishi Materials Corp., both of Tokyo, Japan

[21] Appl. No.: 774,184

[22] Filed: Dec. 26, 1996

[30] Foreign Application Priority Data

Dec. 28, 1995 [JP] Japan .................................... 7-344174
Jan. 9, 1996 [JP] Japan .................................... 8-001837
Jan. 11, 1996 [JP] Japan .................................... 8-003376
Jan. 12, 1996 [JP] Japan .................................... 8-004405

[51] Int. Cl.⁶ .................................................. C30B 35/00
[52] U.S. Cl. ............................................. 117/213; 117/18
[58] Field of Search ................................ 117/18, 30, 31, 117/33, 213

[56] References Cited

U.S. PATENT DOCUMENTS

| 5,306,474 | 4/1994 | Kida et al. ................................ 117/213 |
| 5,324,488 | 6/1994 | Klingshion et al. ..................... 117/213 |
| 5,580,171 | 12/1996 | Lim et al. ................................ 117/213 |
| 5,584,016 | 12/1996 | AlteKrüger et al. .................... 117/214 |
| 5,690,733 | 11/1997 | Nagaii et al. ............................ 117/34 |

FOREIGN PATENT DOCUMENTS 63-303894 12/1988 Japan .
2-255589 10/1990 Japan .
3-164493 7/1991 Japan .
4-305091 10/1992 Japan .

*Primary Examiner*—Felisa Garrett
*Attorney, Agent, or Firm*—Pillsbury Madison & Sutro LLP

[57] ABSTRACT

The principal construction of a single crystal pulling apparatus involves a chamber (gas tight chamber) inside of which is a double crucible 3 for storing a semiconductor melt 21, comprising an outer crucible 11 and an inner crucible 12 communicated with each other, and a source material supply tube 5 suspended from an upper portion of the chamber, and positioned so that granular source material 8 can be introduced from a lower end opening 5a thereof into the semiconductor melt 21 between the outer crucible 11 and the inner crucible 12. An incline portion 13 is provided at a lower end of the source material supply tube 5 on the inner crucible 12 side, for introducing source material 8 discharging from the lower end opening 5a to the semiconductor melt 21 in the vicinity of the side wall of the outer crucible 11. The entry point of the source material 8 is as far as possible from the inner crucible 12, and close to the outer wall of the outer crucible 11, and hence the added source material 8 is melted rapidly by heat from a heater surrounding the outer crucible 11, and any gas bubbles generated as a result of the introduction of the source material 8, are unlikely infuse into the inner crucible 12.

18 Claims, 19 Drawing Sheets

FIG.20A
FIG.20B
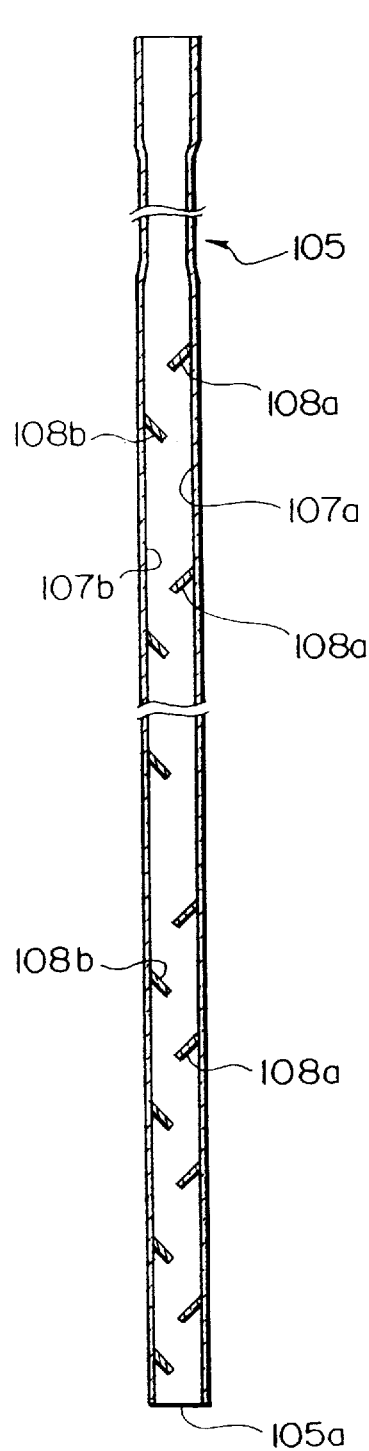
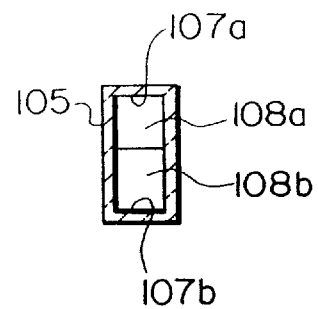

SINGLE CRYSTAL PULLING APPARATUS

FIELD OF THE INVENTION

The present invention relates to a single crystal pulling apparatus for pulling a single crystal of a semiconductor from a semiconductor melt stored in a crucible, and in particular relates to the fitting of a source material supply tube, through which granular source material can be injected into the molten semiconductor held inside the outer crucible of a double crucible arrangement.

DESCRIPTION OF THE RELATED ART

The CZ growth technique is an example of one of the currently known methods for growing single crystals of semiconductors such as silicon (Si) or gallium arsenide (GaAs).

Because this CZ growth technique enables simple generation of large diameter, high purity single crystals which are free from dislocation or have extremely low levels of lattice defects, it is widely used in the growing of a variety of semiconductor crystals.

In recent years, the demand for larger diameter, higher purity single crystals with uniform levels of oxygen concentration and impurity concentration, has grown. In order to meet the growing demand, the CZ growth technique has improved in various ways.

One of the proposed improvements of the aforementioned CZ growth technique is a continuous magnetic field applied to a CZ technique (hereafter abbreviated as CMCZ technique), which employs a double crucible. Features of this method are that it enables the growth of single crystals with good slip-free ratio of crystal bar and with extremely good control of oxygen concentration levels by external application of a magnetic field to the semiconductor melt inside the crucible which suppresses convection in the semiconductor melt. This enables the simple generation of long single crystals of the semiconducting material by allowing continuous supply of the source materials to a position located between outer and inner crucibles. Consequently, this method is recognized as one of the best for obtaining large diameter, long single crystals of semiconducting materials.

FIG. 19 prior art shows an example of a single crystal silicon pulling apparatus proposed in Japanese Patent Application, First Publication, No. Hei-4-305091 which employs the CMCZ technique outlined above. In this single crystal pulling apparatus 101, a double crucible 103, a heater 104, and a source material supply tube 105 are positioned inside a hollow gas tight chamber 102, and a magnet 106 is positioned outside the chamber 102.

The double crucible 103 comprises an approximately hemispherical outer crucible 111 made from quartz ($SiO_2$), and an inner crucible 112 made from quartz, which is a cylindrical partition body which is fitted inside the outer crucible 111. The side wall of the inner crucible 112 contains a plurality of connecting apertures 113 which connect the area between the inner and outer crucibles, 112 and 111 respectively (the source material melt region), with the inside of the inner crucible 112 (the crystal growing region).

This double crucible 103 is mounted on a susceptor 115, which sits on a vertical shaft 114 located centrally at the lower portion of the chamber 102, and can be rotated in a horizontal plane at a specified angular velocity about the axis of the shaft 114. The semiconductor melt (the source material for the generation of single crystals of semiconductor which is melted by heating) 121 is stored inside this double crucible 103.

The heater 104 heats and melts the semiconductor source material inside the crucible and maintains the temperature of the thus produced semiconductor melt 121. Normally, resistance heating is used. The source material supply tube 105 is used to continuously inject a specified volume of semiconductor source material 110, on to the surface of the semiconductor melt between the outer crucible 111 and the inner crucible 112.

The magnet 106 is used to externally apply a magnetic field to the semiconductor melt 121 inside the double crucible 103 and to produce Lorentz forces in the semiconductor melt 121, thereby effecting the control of convection within the semiconductor melt 121, the control of oxygen concentration, the suppression of surface vibration, and so on.

Examples of the source materials 110 which can be supplied through the source material supply tube 105 mentioned above include polysilicon, which has been converted to flake form by crushing in a crusher, or polysilicon granules deposited from gaseous source material using thermal decomposition, with further supply, as necessary, of elemental additives known as dopants, such as boron (B) (in the case of production of p-type single crystals of silicon) and phosphorus (P) (in the case of production of n-type single crystals of silicon).

In the case of gallium arsenide (GaAs), the operation is the same as that outlined above, but in this case, the elemental additive used is either zinc (Zn) or silicon (Si).

With the single crystal pulling apparatus 101 outlined above, a seed crystal 125 is suspended from a pulling shaft 124 located above the inner crucible 112 and over the shaft axis line, and a single crystal of semiconductor 126 is grown at the upper surface of the semiconductor melt 121 around the nucleus of the seed crystal 125.

However, as has been disclosed in Japanese Patent Application, First Publication, No Sho-63-303894, in this type of single crystal pulling apparatus, the growing of single crystals requires that first the polycrystalline source material, such as lumps of polysilicon, be melted and the resulting semiconductor melt 121 stored inside the outer crucible 111, with the double crucible 103 then being formed by positioning the inner crucible 112 above the outer crucible 111, and then mounting it down onto the outer crucible 111.

The reason that the double crucible 103 is formed after melting of the polycrystalline source material, is that in order to effect complete melting of the polycrystalline source material to obtain the semiconductor melt 121, the temperature of the source material inside the outer crucible 111 needs to be raised, using the heater 104, to a temperature hotter than the single crystal growing temperature. If the inner crucible 112 were to be fixed to the outer crucible prior to the melting stage, large thermal deformations of the inner crucible 112 would occur.

Consequently, by fixing the inner crucible 112 to the outer crucible 111 after complete melting of the source material and the subsequent lowering in the heat being applied by the heater 104, the high temperatures required in the initial source material melting stage can be avoided, and deformation of the inner crucible suppressed.

Furthermore, the connecting apertures 113 of the inner crucible 112 are set at a predetermined aperture area small enough to ensure that when source material is added, the semiconductor melt 121 will flow only from the outer crucible 111 to the inner crucible 112. The reason for this restriction is that if the phenomenon arose where, through convection, the semiconductor melt was able to flow from the crystal growing region back to the source material melt region, the control of impurity concentrations during the single crystal growth and the control of the melt temperature would become problematic.

The upper end of the source material supply tube 105 is fixed to an upper wall of the chamber 102 with the tube being suspended approximately vertically from this point and the opening 105a at the lower end of the tube (refer to FIG. 20A) is held at a specified height above the surface of the semiconductor melt 121. In order to prevent contamination, and for construction purposes, the source material supply tube 105 comprises a quartz tube of rectangular cross section. Furthermore, in order to ensure supply of high purity granular silicon at a suitable drop velocity, alternating ladder type swash plates (baffle plates) are fitted inside the source material supply tube 105, as described below.

However, the opening at the lower end of the source material supply tube 105 is several centimeters above the surface of the semiconductor melt, and the source material is stored in the upper portion of the chamber 102 so it is not exposed to radiated heat from the heater 104 or the semiconductor melt 121. Consequently, the injected source material falls vertically from the upper portion of the source material supply tube 105 down to the surface of the semiconductor melt 121, plunging into the semiconductor melt 121 with great velocity. As the source material plunges through the melt surface it causes the splashing of the semiconductor melt 121 and incorporates the surrounding gas into the semiconductor melt, which may inhibit the growth of a good single semiconductor crystal.

If the additional injections of source material fall particularly heavily, or fall down as a large lump, then the source material will penetrate quite deeply down into the semiconductor melt, having considerable effect.

In order to cope with this particular problem, Japanese Patent Application, First Publication, No. Hei-2-255589, and Japanese Patent Application, First Publication, No. Hei-3-164493 propose apparatus in which the lower end of the source material supply tube is fitted with an arrangement for reducing the drop velocity of the source material. An example of the arrangement employed to lower the drop velocity is the fitting of baffle plates or baffle bars to the inside of the source material supply tube, as discussed below.

As shown in FIG. 20A and FIG. 20B, the source material supply tube 105 is a pipe of rectangular cross section with pairs of baffle plates 108a, 108b fitted on facing internal surfaces 107a, 107b of the pipe. Furthermore, the vertical distance between any pair of baffle plates 108a and 108b, fixed to the facing surfaces 107a and 107b respectively, is best kept large, to prevent the source material from blocking the source material supply tube 105, and hence the use of a source material supply tube 105 with a rectangular cross section. By fitting these baffle plates 108a, 108b to the source material supply tube 105 to reduce the drop velocity rate of the source material, the rippling and vibration caused when the source material drops into the semiconductor melt is controlled, thus preventing the generation of crystal defects such as dislocations.

However in present apparatus employing this type of technique, like those shown in FIG. 19, FIG. 20A and FIG. 20B, although the source material 110 drops from the opening 105a at the lower end of the source material supply tube 105 at a predetermined drop velocity, the position at which it drops into the semiconductor melt is not sufficiently close to the side wall of the outer crucible 111 to allow it to melt rapidly. Rapid melting at the sidewall is a result of the apparatus being constructed with the heater 104 surrounding the double crucible 103, causing the temperature of the semiconductor melt 121 inside the outer crucible to be higher the closer it is to the side wall of the crucible 111.

Furthermore, as the position at which the source material 110 drops into the semiconductor melt is not sufficiently far removed from the inner crucible 112, it is possible for gas bubbles generated from the gas which is incorporated into the melt with the injection of source material 110, to travel through the connecting apertures 113, raising the risk of noticeable occurrences of lattice defects such as dislocations.

Furthermore, inserting the rectangular cross section source material supply tube into the narrow space between the inner crucible 112 and the outer crucible 111 generates additional problems.

A first object of the present invention is to provide a single crystal pulling apparatus in which the dropped source material will melt rapidly thereby reducing the occurrence of lattice defects such as dislocations.

Furthermore, as a result of their research, the present inventors discovered that simply lowering the drop velocity of the source material did not resolve the problem of the large impact generated when the source material fell as a lump.

Consequently, a second object of the present invention is to provide a single crystal pulling apparatus which lowers as far as possible, the impact generated upon addition of source material to the semiconductor melt through the source material supply tube.

Next is an explanation of a configuration for supplying source material to the source material supply tube mentioned above. A diagram showing a single crystal pulling apparatus 1 employing the CZ growth technique is shown in FIG. 21. This single crystal pulling apparatus 1 is able to continuously replenish the granulated semiconductor source material. The single crystal pulling apparatus 1, like the apparatus shown in FIG. 19 prior art, incorporates a hollow chamber 102, inside of which is a double crucible 103 holding granulated semiconductor source material Sc1 or alternatively crushed lumps of polycrystalline semiconductor which act as the semiconductor source material, a heater 104 which heats the double crucible 103 and converts the semiconductor source material to a semiconductor melt Sc2, a single crystal pulling device containing a pulling shaft 6 which pulls a single crystal of semiconductor Sc3 from the semiconductor melt Sc2, and a source material supply device 7a which supplies the granulated semiconductor source material Sc1 to the double crucible 103.

The source material supply device 7a comprises a storage supply device 8a which stores and supplies the granulated semiconductor source material Sc1, and a source material supply tube 9 which supplies the granulated semiconductor source material Sc1 from the storage supply device 8a to the double crucible 103 under natural flow conditions. The source material supply tube 9 comprises a plurality of tubes fixedly connected together.

Furthermore, the source material supply device 7a needs to supply suitable quantities of the granulated semiconductor source material Sc1 with appropriate timing, while also ensuring that the supply of the granulated semiconductor source material Sc1 is gentle enough not to ripple the semiconductor melt Sc2. For this reason, short fall times for the granulated semiconductor source material Sc1, and low flow velocities are favorable. In order to satisfy these two opposing requirements, the tilt angle of the source material supply tube 9, needs to be set to an optimum angle.

However, in this type of single crystal pulling apparatus 1, a problem arises in that if the tilt angle of the source material supply tube 9 deviates from the optimum angle due to the effect of external influences such as humidity or air temperature, or internal influences such as deviations in the angle setting, it is difficult to realign.

Consequently, a third object of the present invention is to provide a single crystal pulling apparatus in which the fall time and the flow velocity of the granulated semiconductor source material can be adjusted easily.

Next is an explanation of a support structure for the source material supply tube described above. A single crystal pulling apparatus 1 is shown in FIG. 22, which, like the apparatus shown in FIG. 21, incorporates a double crucible 103 for holding the granulated semiconductor source material Sc1 or alternatively the crushed lumps of polycrystalline semiconductor which act as the semiconductor source material, a heater 104 for heating the double crucible 103 and converting the semiconductor source material to a semiconductor melt Sc2, a single crystal pulling device 205 containing a pulling shaft 205a for pulling a single crystal of semiconductor Sc3 from the semiconductor melt Sc2, a chamber 206 for enclosing the double crucible 103, the heater 104 and the single crystal pulling device 205 in a gas tight atmosphere, and a source material supply tube 207 for supplying the granulated semiconductor source material Sc1 to the double crucible 103. The source material supply tube 207 comprises an internal tube 208 which is positioned inside the chamber 206 and an external tube section 209 which is fitted outside the chamber 206. The internal tube 208 is constructed of quartz and, as is shown in FIG. 25, is fitted internally with multiple, staggered, downward facing baffle plates 208a for reducing the fall velocity of the granulated semiconductor source material Sc1. An upper portion 208b of the internal tube 208 is composed of cylindrical tubing of a larger diameter than the tubing of the lower portion, and an engagement surface 208c is formed on the outer surface of the tubing at the lower extent of this upper portion 208b.

The double crucible 103 shown in FIG. 22 comprises an approximately hemispherical outer crucible 111 made from quartz ($SiO_2$) and a cylindrical inner crucible 112 made from quartz, which is fitted inside the outer crucible 111. The lower portion of the side wall of the inner crucible 112 contains a plurality of connecting apertures 113, which connect the outer crucible 111 with the inner crucible 112. Furthermore, the double crucible 103 is mounted on a susceptor 115, which sits on a vertical shaft 114 located centrally at the lower portion of the chamber 206, and can be rotated in a horizontal plane at a specified angular velocity about the axis CT of the shaft 114.

The heater 104 heats and melts the semiconductor source material inside the outer crucible 111, as well as maintaining the temperature of the thus produced semiconductor melt Sc2, and in this particular configuration employs resistance heating. Furthermore, for heat retention purposes, a heat shield 216 surrounds the heater 104.

Currently, the chamber 206 comprises the main vessel 221, which open upwards and a lid portion 222 which seals the opening. The lid portion 222 is fitted with a supply tube insertion section 223 which contains an insertion aperture 223a through which the internal tube 208 of the source material supply tube 207 is inserted. The supply tube insertion section 223 is fitted with a supply tube stopping portion 225.

Current supply tube stopping portions 225, like those shown in FIG. 24, consist of a two piece split mold 226,227 and a split mold support section 229, which contains a fitting aperture 229a into which the two pieces of the split mold 226,227 are fitted when held together, as shown in FIG. 23. The two piece split mold 226,227 forms an engagement aperture 228 when the two pieces of the mold are fitted together, as shown in FIG. 24. As shown in FIG. 23, the lower portion of the aperture wall of the engagement aperture 228 displays a narrowing in diameter, forming an upward facing engagement surface 228a. The upper portion 208b of the internal tube 208 is inserted and fitted into the engagement aperture 228, with the engagement surface 208c of the upper portion 208b being mounted and engaged on to the engagement surface 228a of the aperture wall of the engagement aperture 228.

Furthermore, as shown in FIG. 22, the lower portion of the internal tube 208 is inserted into a tubular guide 231, and this guide 231 is supported on an annular attachment member 232, which is fitted to the upper section of the heat shield 216.

Next is an explanation of the method used for forming a single crystal of semiconductor Sc3, using the single crystal pulling apparatus 1, described above.

First crushed lumps of polycrystalline semiconductor are placed in the outer crucible 111 as the semiconductor source material, and the upper portion 208b of the internal tube 208 is pushed through the supply tube inlet aperture 223a of the lid portion 222 and the fitting aperture 229a of the split mold support section 229, into the upper part of the split mold support section 229. Next, the two pieces of the split mold 226,227 are fitted together, and the mold fitted into the fitting aperture 229a of the spit mold support section 229, while the upper portion 208b of the internal tube 208 is engaged in the engagement aperture 228 formed by the two pieces of the split mold 226,227. This enables the internal tube 208 to be installed so that the lower end of the tube is situated between the outer edge of the outer crucible 111, and the inner crucible 112, as shown in FIG. 22. The external tube section 209 is then connected to the upper end of the internal tube 208. The lid portion 222 is then closed and the internal tube 208 inserted into the guide 231 and positioned inside the main vessel 221 of the chamber 206.

Next, the chamber 206 enclosing the double crucible 103 is evacuated with a vacuum pump or the like, to produce a vacuum, an inert gas such as argon (Ar) is introduced to produce an inert atmosphere in the chamber, and the shaft 114 rotated in a horizontal plane about the axis CT at a constant angular velocity. With the double crucible 103 being rotated at a constant angular velocity, the heater is then activated, and the source material inside the double crucible 103 heated to a temperature exceeding the single crystal growing temperature, to melt the source material and form the semiconductor melt Sc2.

Once all the source material has melted to form the semiconductor melt Sc2, the electrical power to the heater 104 is adjusted so the surface temperature in the middle area of the semiconductor melt Sc2 is maintained at the single crystal growing temperature, and after the seed crystal Sc4, which is suspended from the pulling shaft 205a of the single crystal pulling device 205, is contacted with the semiconductor melt Sc2, the seed crystal Sc4 is pulled vertically upwards at a constant velocity, and a single crystal of semiconductor Sc3 is grown around the nucleus of this seed crystal Sc4. Thus, following preparation of a seed crystal Sc4 which is free of dislocation, the diameter of the single crystal Sc3 is gradually increased to produce a single crystal semiconductor Sc3 of specified diameter.

Furthermore, in this crystal growing process, the granulated semiconductor source material Sc1 is added continuously from the source material supply tube 207 to the double crucible 103, at a point between the outer edge of the outer crucible 111 and the inner crucible 112, at a rate in proportion to the growth rate (pull rate) of the single crystal of semiconductor, and this granulated semiconductor source material Sc1 melts inside the outer crucible 111 and passes through the connecting apertures 113 to the inner crucible 112, generating a continuous supply. Using the processes outlined above it is possible to grow single crystals of semiconductor Sc3 of high crystallinity(crystal structure)

However, with this type of single crystal pulling apparatus 1, a problem exists in that the task of installing the internal tube 208 of the source material supply tube, shown in FIG. 23, involves the intricate and complex tasks of fitting the two pieces of the split mold 226,227 together to form the engagement aperture 228, and then fitting the closed mold into the fitting aperture 229a of the split mold support section 229. Furthermore, if it becomes necessary to alter the diameter of the double crucible 103 used in FIG. 22, further complexities arise in that a special bent internal tube 218, like that shown in FIG. 26, must be used, with the amount of bending dependent on the size of the double crucible 103 employed. A further problem is that during the growing of the single crystal of semiconductor Sc3, the heat from the single crystal radiates from the supply tube stopping portion 225 and causes overheating of the upper portion 208b (218a) of the internal tube 208 (218), lowering the usable life of the internal tube 208 (218).

A fourth object of the present invention is to provide a single crystal pulling apparatus in which the installation of the internal tube of the source material supply tube can be completed easily and rapidly, in which the crucible can be exchanged easily, and in which the life of the internal tube can be extended.

DISCLOSURE OF THE INVENTION

The single crystal pulling apparatus of the present invention for meeting the first object outlined above incorporates: a gas tight container, a crucible inside the gas tight container for holding a semiconductor melt; a source material supply tube suspended from an upper portion of the gas tight container, the lower opening of which is positioned to allow addition of granulated source material to a semiconductor melt held in the crucible; and an inclined portion provided at a lower portion of the source material supply tube for ensuring that the source material exiting from the lower opening of the source material supply tube, drops into the semiconductor melt in the vicinity of a side wall of the crucible.

Furthermore, the crucible comprises an outer crucible and an inner crucible communicated with each other, and the source material supply tube introduces the source material exiting from the lower opening into the semiconductor melt, to between the outer crucible and the inner crucible, and in the vicinity of a side wall of the outer crucible.

With the present invention, because of the inclined portion provided at the lower portion of the source material supply tube, the source material which falls down the inside of the source material supply tube falls into the semiconductor melt in the vicinity of the side wall of the outer crucible, resulting in it breaking the surface of the semiconductor melt at a point sufficiently distant from the inner crucible.

Consequently, the added source material is melted rapidly by the heater, and as the entry point is as far as possible from the inner crucible, any gas bubbles generated in the semiconductor melt from gas incorporated into the melt along with the source material entry, are unlikely to travel through the connecting apertures into the inner crucible. This ensures maximum reduction in the occurrence of lattice defects such as dislocations.

As a single crystal pulling apparatus of the present invention for meeting the second object outlined above, the inclined portion serves as source material scattering device which applies a horizontal component of force to the source material which drops from the source material supply tube, and thus scatters the source material over the surface of the semiconductor melt.

With the present invention, because of the source material scattering device provided at the lower portion of the source material supply tube, a horizontal component of force is applied to the source material which drops from the source material supply tube, thus enabling the scattering of the source material over a wide area Consequently, the problem of lumps of source material falling into the semiconductor melt is removed, and problems such as localised temperature drop in the melt, and the heavy impact of the source material as it enters the semiconductor melt are suppressed to minimum levels, thus removing one of the factors inhibiting good semiconductor single crystal growth.

As a single crystal pulling apparatus of the present invention for meeting the third object outlined above, a storage supply device is provided for storing the source material and supplying the source material to the source material supply tube, and the source material supply tube contains a flexible section.

With the present invention, because the storage supply device is able to be moved freely relative to the crucible, then by altering the relative height of the storage supply device above the crucible it is possible to easily adjust the flow time of the granulated semiconductor source material from the storage supply device to the crucible, and the flow velocity with which the material enters the crucible. Furthermore, by slackening the lower portion of the flexible tube in the source material supply tube it is possible to rapidly reduce the flow velocity of the granulated semiconductor source material in that lower portion, allowing a reduction in the flow velocity of the granulated semiconductor source material without reducing the flow time below currently observed levels.

As a single crystal pulling apparatus of the present invention for meeting the fourth object outlined above; the source material supply tube passes through a lid portion of the gas tight container, and the source material supply tube has an internal tube positioned inside the gas tight container and stoppingly engaged by an engagement surface at a lower end portion of an outer surface of an upper wide diameter portion; and the lid portion of the gas tight container is formed with a supply tube insertion section for insertion of the internal tube; and the supply tube insertion section has an engagement aperture through which the internal tube is inserted and then stoppingly engaged thereby, and an aperture wall of the engagement aperture is provided with a supply tube stopping portion formed by an upward facing engagement surface; and furthermore, the supply tube stopping portion is formed with an insertion aperture positioned adjacent to the engagement aperture, for insertion of an upper end portion of the internal tube, and a connection aperture located between the insertion aperture and the engagement aperture for passing the internal tube from the insertion aperture to the engagement aperture.

With the present invention, when the internal tube of the source material supply tube is positioned and installed inside the gas tight container, the upper portion of the internal tube can be inserted upwards through the insertion aperture of the supply tube stopping portion so that the installation of the internal tube can be completed by passing the internal tube through the connection aperture to the engagement aperture of the supply tube stopping portion and mounting and engaging the engagement surface on the outer surface of the upper portion of the internal tube into the engagement surface of the engagement aperture. Therefore, in comparison with currently employed methods requiring both, the fitting together of two pieces of a split mold to form an engagement aperture and then the fitting of the closed mold into the fitting aperture of the split mold support section, the present invention enables easy and rapid installation of the internal tube.

BRIEF DESCRIPTION OF THE DRAWINGS

FIG. 20A is a longitudinal cross-sectional view of the source material supply tube shown in FIG. 19, and FIG. 20B is a transverse cross-sectional view of the source material supply tube shown in FIG. 19;

DESCRIPTION OF THE PREFERRED EMBODIMENTS

Figure 1:
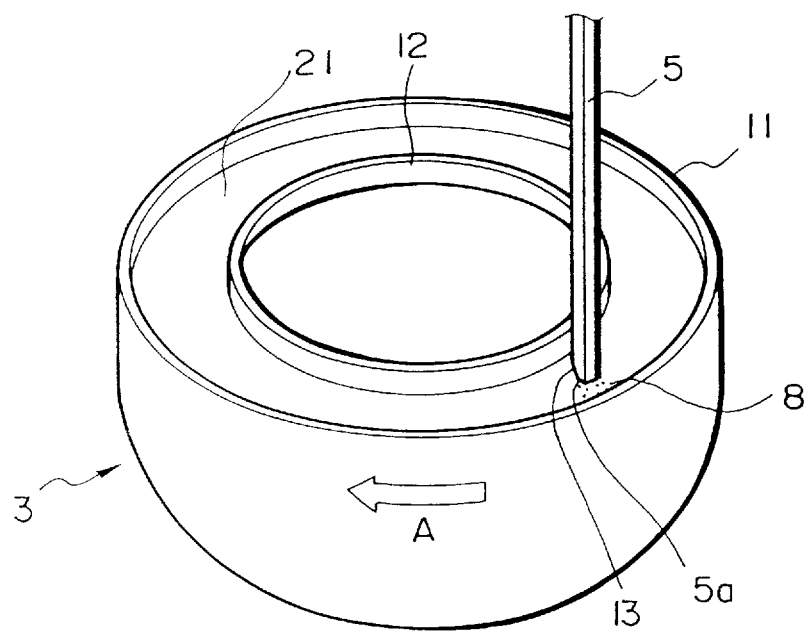
FIG. 1 is a perspective view of a double crucible and source material supply tube of a first embodiment of a single crystal pulling apparatus of the present invention.
Figure 2:
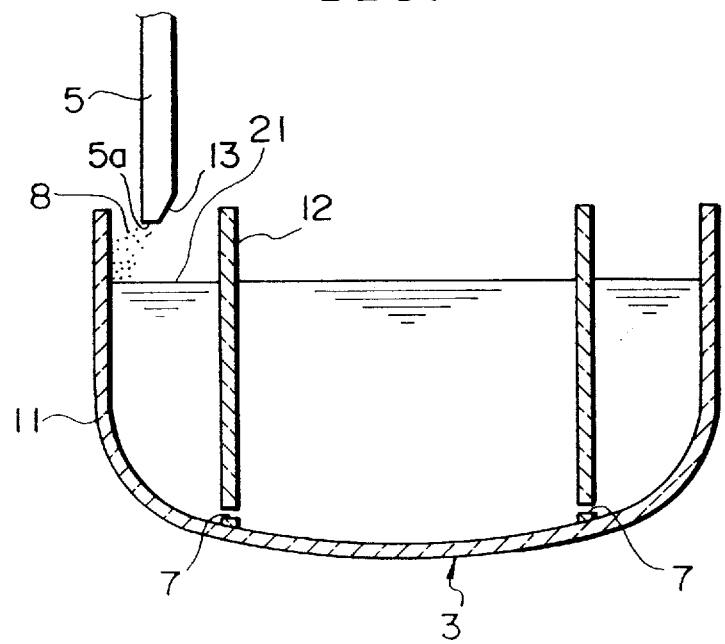
FIG. 2 is a side cross-sectional view of FIG. 1.
Figure 3:
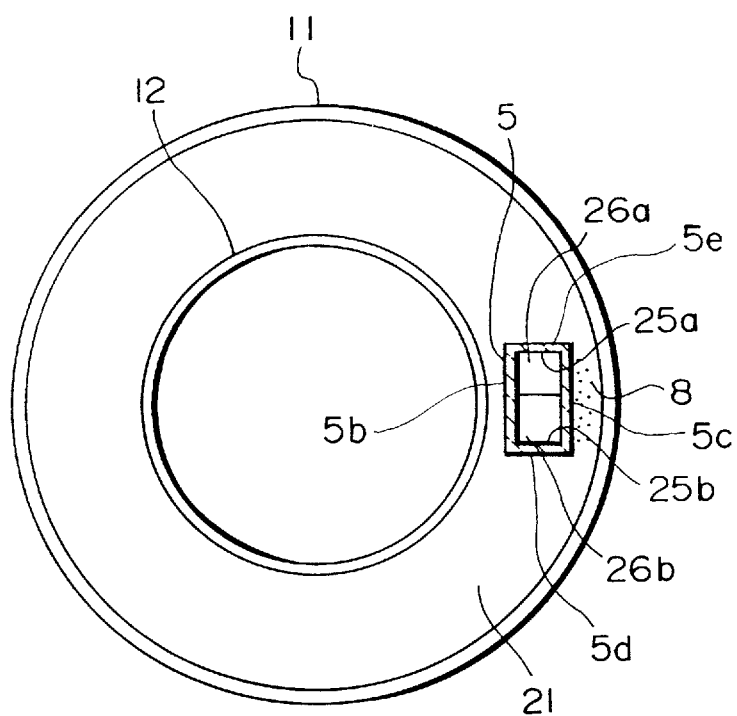
FIG. 3 is a plan view of FIG. 1.
Figure 19:
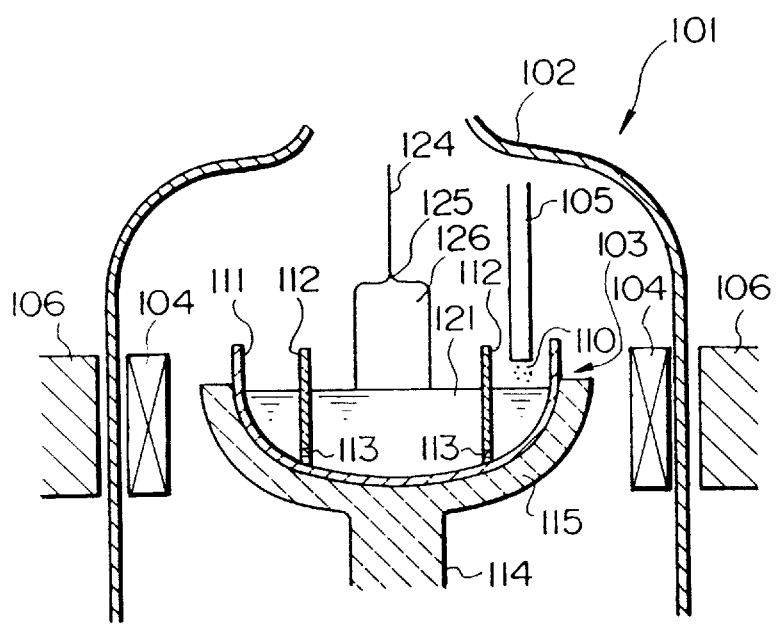
FIG. 19 is a diagram showing the essential features of a currently used single crystal pulling apparatus.

As shown in FIGS. 1–3, a silicon single crystal pulling apparatus of a first embodiment is similar to the apparatus shown in FIG. 19, with numerals 3, 5, 11, 12 and 21 referring respectively to a double crucible which is rotated at a specified angular velocity (refer to arrow A), a source material supply tube, an outer crucible, an inner crucible, and a semiconductor melt, with the inner crucible 12 being equipped with a plurality of the beforementioned connecting apertures 7.

The source material supply tube 5 is a device for continuously supplying granulated source material 8 to the semiconductor melt 21 (in this example a silicon melt) at a point on the melt surface between the outer crucible 11 and the inner crucible 12. Examples of the source materials which are supplied through the source material supply tube 5 include ingots of polysilicon which have been converted to flake form by crushing in a crusher, or polysilicon granules deposited from gaseous source material using thermal decomposition, and as necessary, elemental additives known as dopants, such as boron (B) and phosphorus (P) are also added.

Next is an explanation of the characteristic parts of the present invention.

Figure 4A:
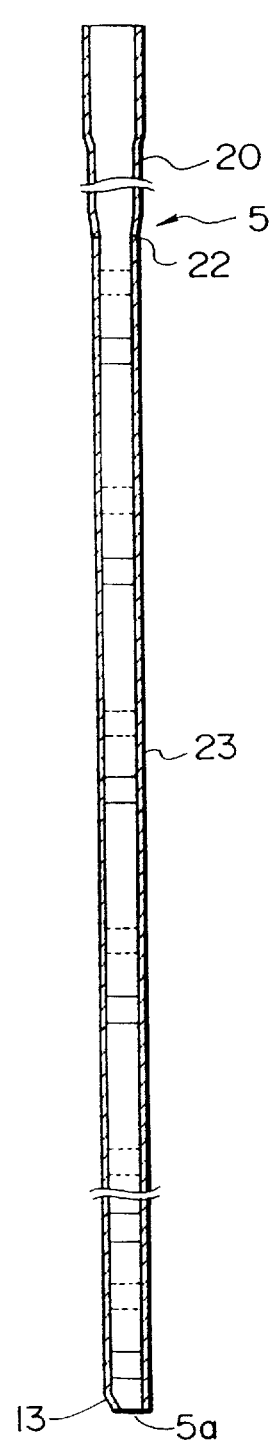
FIG. 4A is a longitudinal cross-sectional view of a source material supply tube of the first embodiment.
Figure 4B:
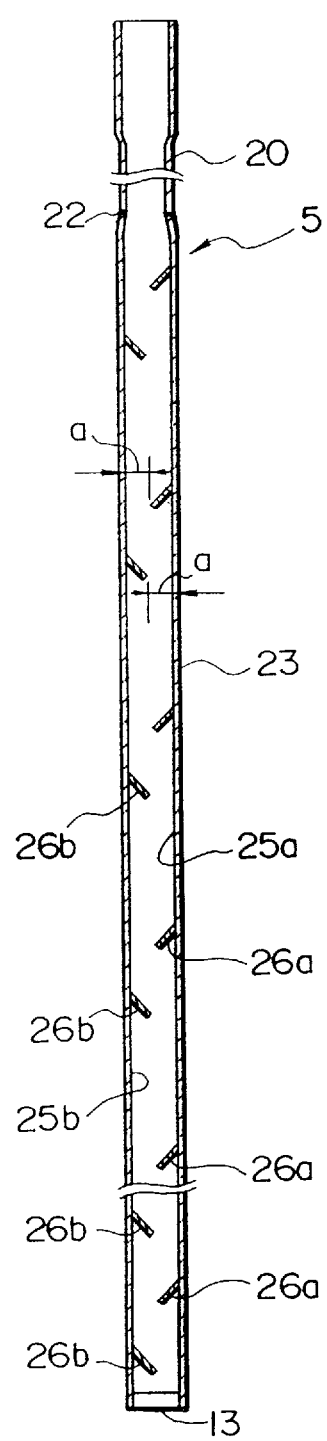
FIG. 4B is a corresponding cross-sectional view.

The source material supply tube 5 is supported in a chamber 2, and is suspended approximately vertically. Source material 8 is supplied to an upper end of the source material supply tube 5, and exits from an opening at a lower end 5a. Furthermore, as shown in FIG. 4A and FIG. 4B, the source material supply tube 5 is constructed of an upper pipe member 20 which is straight and has a circular cross section, and a lower pipe member 23 which is connected to a lower end of the upper pipe member 20 and has a transverse cross section. The source material supply tube 5 is positioned so that walls 5b, 5c corresponding to the two longer sides of the transverse cross section, are facing the inner crucible 12 and the outer crucible 11 respectively. That is, the walls 5b and 5c are positioned perpendicularly to the radial direction of the double crucible 3. Numeral 22 refers to a joint (connecting portion) between the two pipe members 20, 23. Furthermore, the upper pipe member 20 is a portion which passes through and is supported by a lid portion of the chamber 2.

With the lower pipe member 23 of the source material supply tube 5, a plurality of baffle plates are fitted alternately down two inner walls 25a, 25b, corresponding to two shorter sides 5d, 5e of the transverse cross section. That is, ladder type swash plates 26a, 26b are fitted in an alternate arrangement.

Figure 5A:
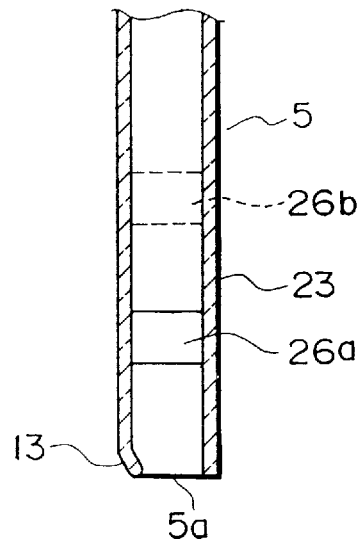
FIG. 5A is an enlarged view of a lower portion of the source material supply tube shown in FIG. 4A and FIG. 4B.
Figure 5B:
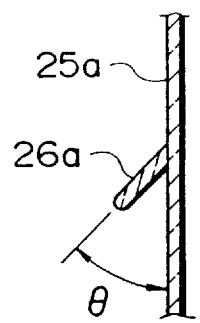
FIG. 5B is an enlarged view of baffle plates shown in FIG. 4B.
Figure 5C:
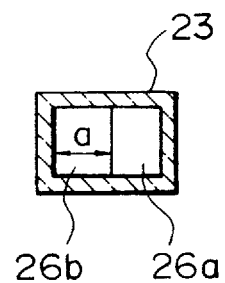
FIG. 5C is a transverse cross-sectional view of the source material supply tube shown in FIG. 4A and FIG. 4B.
Figure 6:
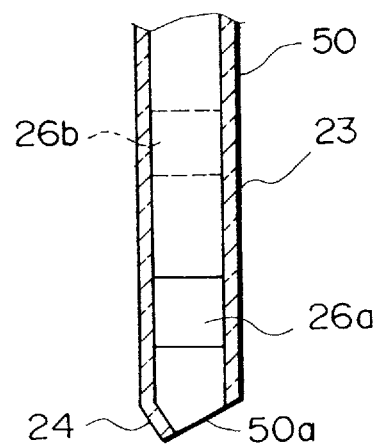
FIG. 6 is an enlarged view of a lower portion of a modified example of the source material supply tube shown in FIG. 5A.
Figure 7:
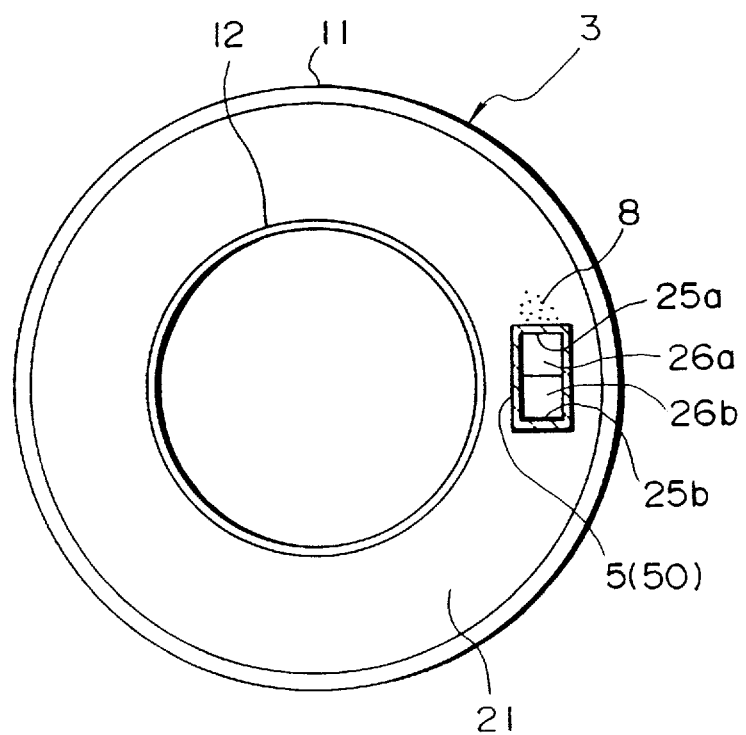
FIG. 7 is the same view as FIG. 3, but represents the situation when the source material supply tube does not incorporate an inclined portion.

A tilt angle θ (refer to FIG. 5B) of the baffle plates 26a, 26b is approximately 45°, but is not restricted to this particular value. Furthermore, in order to minimize the velocity with which the source material 8 drops from the opening 5a at the lower end of the lower pipe member 23, the pitch between the baffle plates 26*a*, 26*b* is smallest in the lower portion of the lower pipe member 23, but this is not a restriction of the apparatus.

Moreover, a distance a (refer to FIG. 4B and FIG. 5C) between the two inner walls 25*a*, 25*b* and the leading edges of the baffle plates 26*a*, 26*b* is approximately 9 mm, but this is not a restriction of the apparatus.

Furthermore, the leading edges of the alternate baffle plates 26*a*, 26*b* are overlapped by approximately 1 mm, but this is not a restriction of the apparatus. However, if the amount of this overlap is too large, there is a danger of the source material becoming blocked inside the source material supply tube.

A lower end of the source material supply tube 5 facing the inner crucible 12 comprises an inclined portion 13 for directing the source material which drops from the opening 5*a* at the lower end of the lower pipe, to an area of the semiconductor melt 21 in the vicinity of the side wall of the outer crucible 11. The inclined portion 13 is inclined towards the outer crucible 11, with the opening 5*a* at the lower end of the lower pipe being in the horizontal plane.

The source material 8, the drop velocity of which has been sufficiently lowered by the baffle plates 26*a*, 26*b* inside the source material supply tube 5, enters the semiconductor melt 21 in the vicinity of the side wall of the outer crucible 11 due to the inclined portion 13 at the lower end of the source material supply tube 5, resulting in an entrance into the semiconductor melt 21 at a position as far as possible from the inner crucible. Furthermore, some of the source material which falls from the opening 5*a* at the lower end of the source material supply tube makes contact with the side wall of the outer crucible 11 before entering the semiconductor melt 21.

In this way the source material 8 which enters the semiconductor melt is melted rapidly by the heater (not shown in figures), and the gas bubbles generated from the gas incorporated into the melt are unlikely to pass through the connecting apertures 7 of the inner crucible 12 into the inner crucible 12. This results in maximum reduction in the occurrence of lattice defects such as dislocations.

With the first embodiment outlined above, the source material supply tube 5 is positioned so that the walls 5*b* and 5*c* corresponding to the two longer sides of the rectangular cross section, are facing the inner crucible 12 and the outer crucible 11 respectively, and moreover, the alternating baffles plates 26*a*, 26*b* are fitted to the two inner walls 25*a*, 25*b* of the source material supply tube 5 corresponding to the two shorter sides 5*d*, 5*e* of the rectangular cross section. This makes it very easy to insert the source material supply tube 5 into the narrow space between the outer crucible 11 and the inner crucible 12, and moreover prevents the source material from becoming blocked inside the source material supply tube 5. Furthermore, the apparatus is not limited to the configuration described above, and the source material supply tube 5 may also be positioned so that the walls 5*d*, 5*e* corresponding to the two shorter sides of the rectangular cross section, are facing the inner crucible 12 and the outer crucible 11 respectively, The configuration of the inclined portion 13 of the source material supply tube 5 is not limited to that outlined above, with for example the construction shown in FIG. 6 also being suitable in FIG. 6, the lower end of the source material supply tube 50 on the side of the inner crucible (not shown in the figure) is extended a little, and curved towards the outer crucible (not shown in the figure) forming an inclined portion 24, and so the source material supply tube 50 differs from those shown in FIG. 1 through FIG. 5A in that the opening 50*a* at the lower end of the lower pipe section 23 is tilted.

FIG. 7 shows an example situation where the source material supply tube 5 shown in FIGS. 4A–4B and FIG. 6 does not incorporate an inclined portion, and in this case, the source material 8 which falls from the source material supply tube 5 enters the semiconductor melt 21 in lumps, and in the circumferential direction of the double crucible 3, making the occurrence of circumferential eddies likely, which is undesirable.

A CMCZ technique can be employed with the single crystal pulling apparatus, however provided the apparatus is a double crucible type configuration, other single crystal production methods may be applied. For example, a continuous charge CZ growth technique (CCZ technique), which does not involve application of a magnetic field, may be employed.

Next is an explanation of the other embodiments of the present invention.

A second embodiment of the present invention is shown in FIG. 8A. In this second embodiment, there is a capture plate (inclined portion, source material scattering device) 51*a* fitted beneath a lower end opening 55*a* of the source material supply tube 55, which catches the source material 40 which exits from the opening 55*a* (as indicated by arrows). The capture plate 51 a has a larger surface area than the lower end opening 55*a* and is fixed by four stays 52 which extend from the lower end of the source material supply tube 55. A suitable space 53 is maintained between the lower end of the source material supply tube 55 and the capture plate 51*a* to ensure that the source material 40 falls outside the edges of the capture plate 51*a*. Furthermore, the capture plate 51*a* is inclined downwards in at least one of, the direction of the rotation of the double crucible 3 (refer FIG. 9), and-the direction towards the external wall of the outer crucible 11 (refer FIG. 9).

With the configuration of the exit of this source material supply tube 55, all the source material 40 which drops through the source material supply tube 55 is caught by the capture plate 51*a*, and after its drop velocity is reduced by the plate, spills off the edges of the plate 51*a*. In this process, the action of the capture plate 51*a*, or alternatively the pile of source material 40 accumulated on the capture plate, applies a horizontal force component to the motion of the source material 40, causing the source material to be scattered over a region wider than the surface area of the capture plate 51a. Consequently, due to the reduction in the drop velocity and the scattering action of the capture plate 51a, the source material enters the semiconductor melt with very little impact.

In the case where the capture plate 51a is inclined downward in the direction of the rotation of the double crucible 3 (refer FIG. 9), because the source material contacts the semiconductor melt while moving in the same direction that the surface of the semiconductor melt is being moved, the impact at the moment of contact is particularly small, and the depth to which the source material 40 penetrates the melt is also reduced. As a result, the influence exerted on the semiconductor melt is reduced. Furthermore, in the case where the capture plate 51a is inclined downward towards the external wall of the outer crucible 11, the addition of new source material to the melt occurs at a position most distant from the inner crucible 12, so any influence exerted on the semiconductor melt inside the inner crucible 12 is suppressed to a minimum.

Figure 8A:
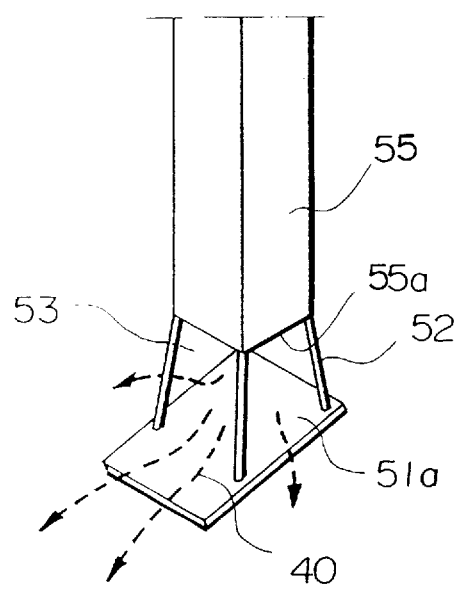
FIG. 8A is a perspective view of the essential elements of a source material supply tube of a second embodiment of the present invention.
Figure 8B:
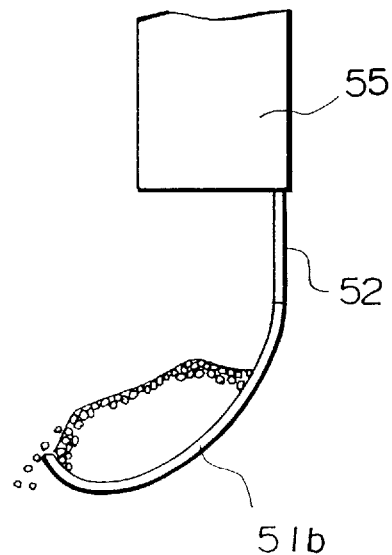
FIG. 8B is a diagram showing a modified example of the second embodiment.

Furthermore, a curved capture plate 51b like that shown in FIG. 8B may also be used.

Figure 9:
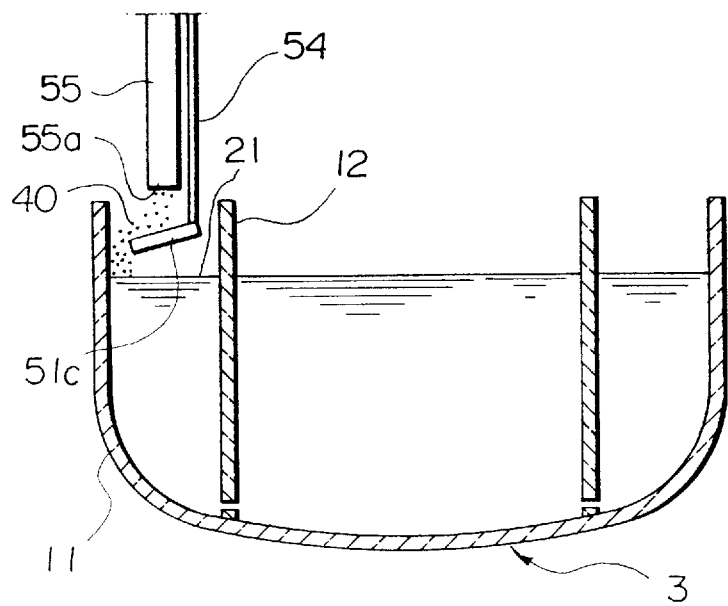
FIG. 9 is a side cross-sectional view of a double crucible of a third embodiment of the present invention.

A third embodiment of the present invention is shown in FIG. 9. With the third embodiment, a capture plate 51c is supported by a separate support member 54 and is not supported directly by the source material supply tube 55. The remainder of the configuration is the same as that of FIG. 8A.

As outlined above, the capture plate 51a (51b, 51c) is provided at the lower end of the source material supply tube 55 as a means of scattering the source material, and this capture plate applies a horizontal force component to the motion of the source material 40 which drops down through the source material supply tube 55, enabling the source material 40 to be scattered over a wide area. Consequently, the possibility of the source material 40 entering the semiconductor melt 21 in lumps disappears, and hence problems such as the impact generated as the source material enters the semiconductor melt 21, and localised temperature drop in the melt, are suppressed to a minimum, thus removing one of the causes of inhibition of good semiconductor single crystal growth.

Furthermore, a source material scattering device (inclined portion) is provided by the capture plate 51a (51b, 51c), so the drop velocity of the source material 40 can be reduced, and the source material 40 which drops down from the source material supply tube can be scattered over a wide area of the surface of the semiconductor melt 21. In this situation, by inclining the capture plate 51a (51b, 51c) in a specific direction (in the direction of the rotation of the double crucible 3, or the direction towards the side wall of the outer crucible 11) it is possible to maximize the scattering effect. In the case where the capture plate 51a is supported by the source material supply tube 55, there is no necessity to provide a separate support structure, while in the case where the capture plate 51c is supported by a separate support member 54, the supporting structure for the capture plate 51c can be very simple.

Figure 10:
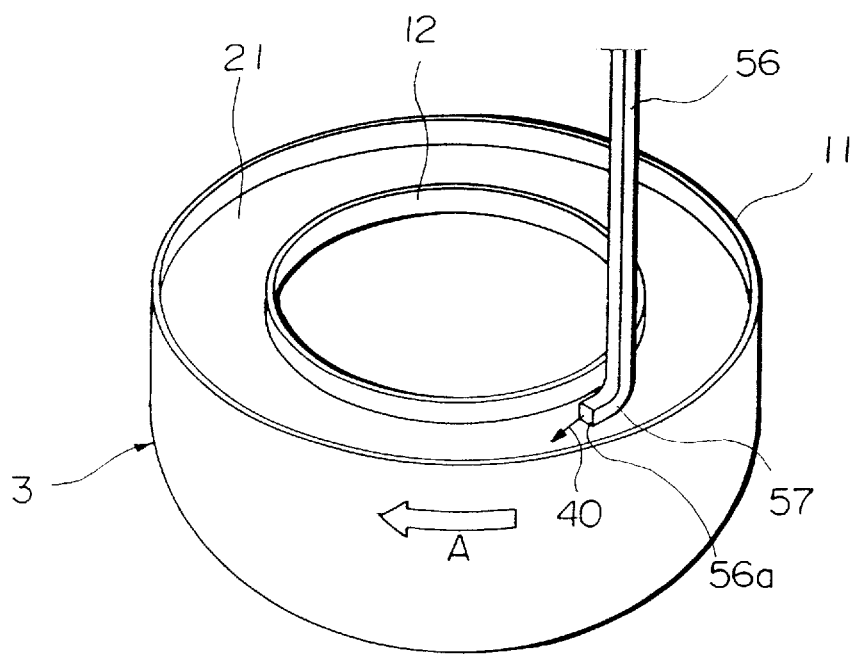
FIG. 10 is a perspective view of a double crucible of a fourth embodiment of the present invention.

A fourth embodiment of the present invention is shown in FIG. 10. With this fourth embodiment, a source material scattering device is provided by a curved portion 57 at the lower end of the source material supply tube 56, formed by curving the tubing towards the horizontal, and the end opening 56a of this curved portion 57 faces in the direction in which the double crucible 3 is rotated (arrow A).

With this configuration the source material 40 which falls down through the source material supply tube 56 has its speed lowered and a horizontal force component applied to its motion by passage through the curved portion 57, and is then scattered over the surface of the semiconductor melt 21. Because the direction in which the source material discharges from the end of the curved portion 57 is the same as the direction in which the surface of the semiconductor melt 21 is moving, for the reasons outlined above, a good scattering effect can be achieved. Furthermore, the point at which the source material 40 enters the melt is distant from the side wall of the inner crucible 12, meaning any effect on the semiconductor melt 21 inside the inner crucible 12 is suppressed to a minimum.

Figure 11:
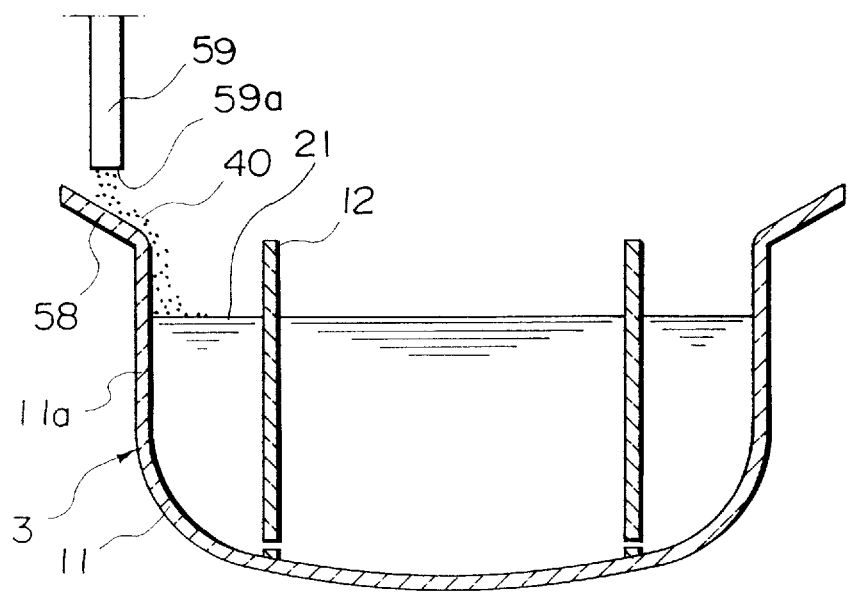
FIG. 11 is a side cross-sectional view of a double crucible of a fifth embodiment of the present invention.

A fifth embodiment of the present invention is shown in FIG. 11. With this fifth embodiment, a source material scattering device is provided by an inclined wall 58 connected to the upper edge of the outer wall 11a of the outer crucible 11, which slopes down towards the crucible, with a lower end opening 59a of the source material supply tube 59 being positioned above this inclined wall.

The source material 40 which exits from the opening 59a at the lower end of the source material supply tube 59 hits the inclined wall 58 and loses speed, and then falls down the inclined wall and into the semiconductor melt 21. In this case, the source material 40 which falls down the inclined wall 58, moves in an approximately horizontal direction, meaning it is scattered over a wide area of the surface of the semiconductor melt 21, and contacts the melt with a reduced impact. Furthermore, the point at which the source material 40 enters the melt is close to the outer wall of the outer crucible 11, meaning any effect on the semiconductor melt 21 inside the inner crucible 12 is suppressed to a minimum.

The construction of a source material scattering device can be achieved simply by configuring a curved portion 57 at the lower end of the source material supply tube which faces in the direction of the rotation of the double crucible 3, as shown in FIG. 10, or by configuring an inclined wall 58 on the upper edge of the outer wall of the outer crucible 11, as shown in FIG. 11.

In the second, third, fourth and fifth embodiments outlined above, the configuration of the baffle plates (not shown in figures) inside the source material supply tubes is the same as that of the first embodiment.

Figure 12:
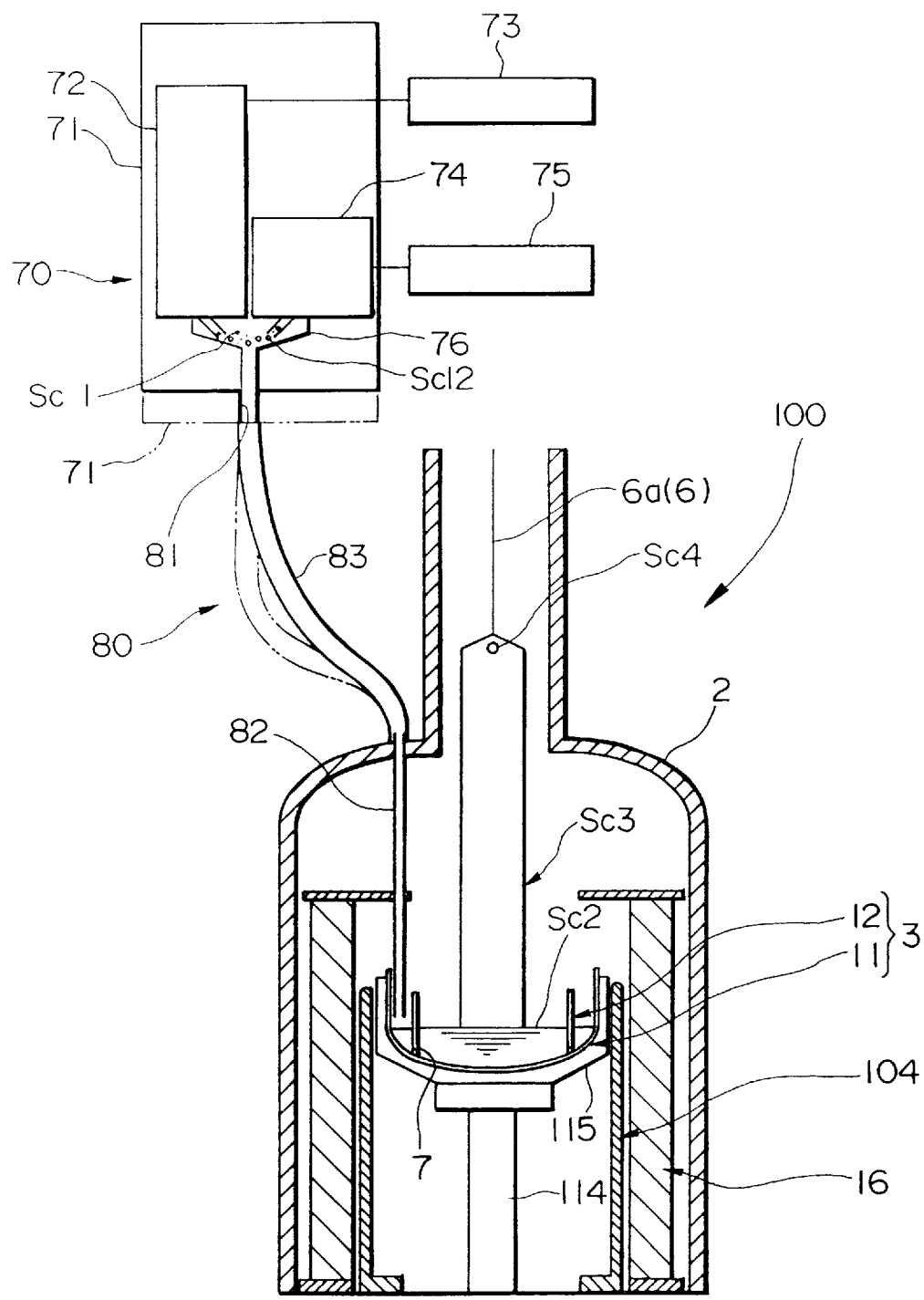
FIG. 12 is a diagram showing a sixth embodiment of a single crystal pulling apparatus of the present invention.
Figure 21:
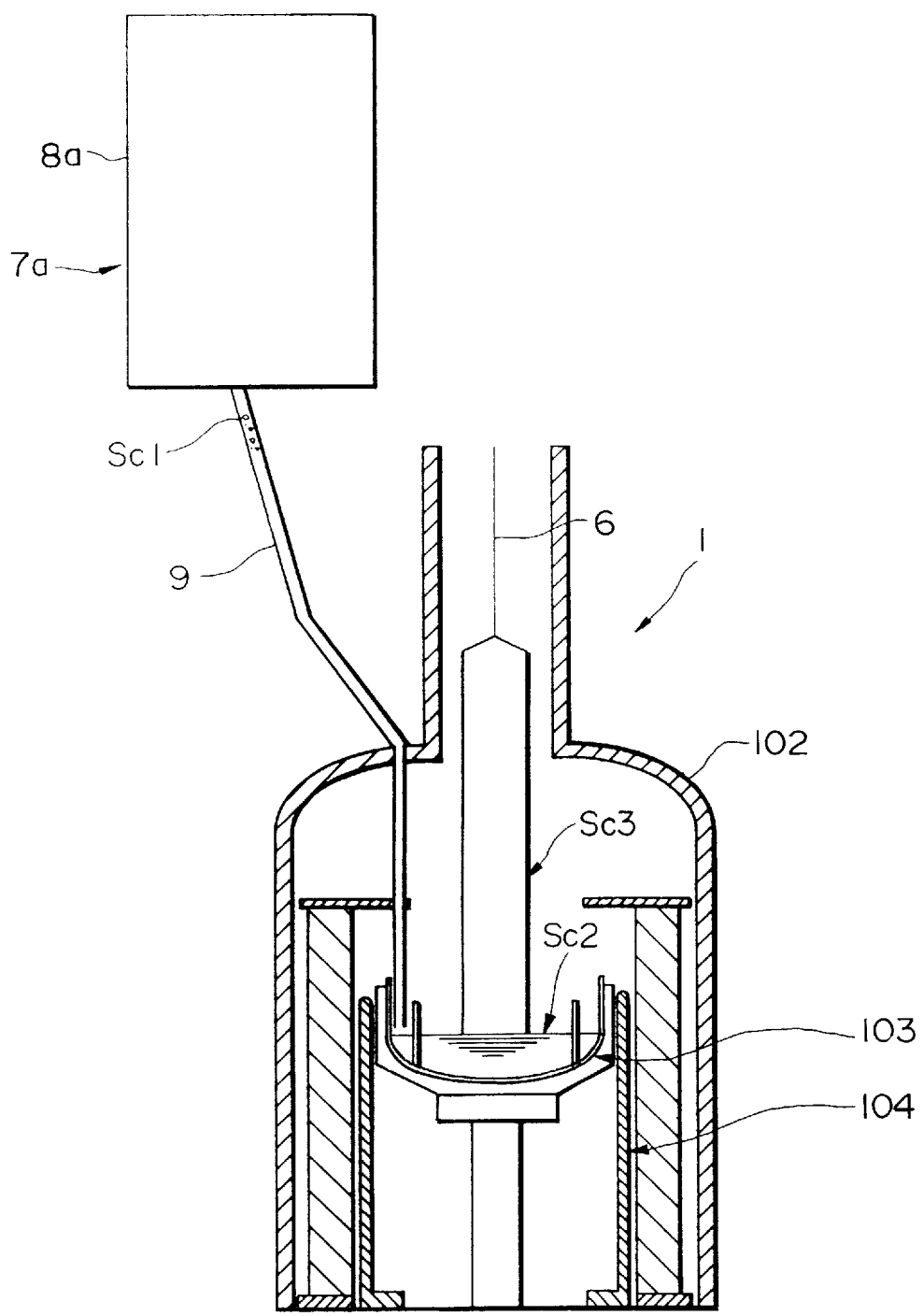
FIG. 21 is a diagram showing an almost complete view of a single crystal pulling apparatus which incorporates a currently employed source material supply tube.

A sixth embodiment of the present invention is shown in FIG. 12. The single crystal pulling apparatus of the sixth embodiment is essentially the currently used single crystal pulling apparatus 1 shown in FIG. 21 with the source material supply device 7a substituted with an improved source material supply device 70. The remainder of the structure is the same as that shown in FIG. 21, with the double crucible 103 comprising an approximately hemispherical outer crucible 11 made from quartz ($SiO_2$), and a cylindrical inner crucible 12 made from quartz which is fitted inside the outer crucible 11, and with the lower section of the side wall of the inner crucible 12 containing a plurality of connecting apertures 7 which connect the outer crucible 11 and the inner crucible 12.

The double crucible 3 is mounted on a susceptor 115 which sits on a vertical shaft 114 located centrally at the lower portion of the chamber 2, and can be rotated in a horizontal plane at a specified angular velocity about the axis of the shaft 114. A semiconductor melt Sc2 is stored inside this double crucible 3.

A heater 104 heats and melts the granulated semiconductor source material Sc1, or alternatively the crushed lumps of polycrystalline semiconductor which act as the semiconductor source material, inside the outer crucible 111, as well as maintaining the temperature of the thus produced semiconductor melt Sc2, and in this particular configuration employs resistance heating. Furthermore, for heat retention purposes, a heat shield 16 surrounds the heater 104.

A suitable example of the granulated semiconductor source material Sc1 mentioned above is polysilicon granules deposited from gaseous source material using thermal decomposition, and in order to maintain the resistance in the direction of the growth axis at a constant level, elemental additives known as dopants, such as boron (B) (in the case of production of p-type single crystals of silicon) and phosphorus (P) (in the case of production of n-type single crystals of silicon) may be added as necessary.

The source material supply device 70 comprises a storage supply device 71 which stores the granulated semiconductor source material Sc1 and the dopant Sc12, and then supplies that granulated semiconductor source material Sc1 and dopant Sc12, and a source material supply tube 80 which directs the natural downward flow of the granulated semiconductor source material Sc1 and dopant Sc1 supplied by the storage supply device 71, and supplies it to the double crucible 3.

The storage supply device 71 comprises a granulated source material storage supply device 72 which stores the granulated semiconductor source material Sc1, and by means of minute vibrations continuously supplies a suitable quantity of the granulated semiconductor source material Sc1, a controller 73 which controls the supply of granulated semiconductor source material Sc1 from this granulated source material storage supply device 72, a dopant storage supply device 74 which stores the dopant Sc12 and intermittently supplies suitable quantities of the dopant, a controller 75 which controls the supply of dopant Sc12 from the dopant storage supply device 74, and a hopper 76 which catches the granulated semiconductor source material Sc1 supplied by the granulated source material storage supply device 72 and the dopant Sc12 supplied by the dopant storage supply device 74, and guides their subsequent downward flow.

The source material supply tube 80 comprises; an upper tube 81 made of quartz which is connected to the exit of the hopper 76, a lower tube 82 made of quartz which passes through a lid portion of the chamber 2 and is positioned to face an outer wall of the inner crucible 12, fitted inside the outer crucible 11 of the double crucible 3, and a flexible tube 83 which is positioned between, and connects together, the upper tube 81 and the lower tube 82. This flexible tube 83 represents a flexible portion of the source material supply tube 80, and in this embodiment the flexible tube 83 employs flexible Teflon tubing.

Next is an explanation of a method of forming a single crystal of semiconductor Sc3 using the single crystal pulling apparatus 100 mentioned above.

First, semiconductor source material comprising crushed lumps of polycrystalline semiconductor is placed in the outer crucible 11, and the chamber 2 evacuated using a vacuum pump or the like, to produce a vacuum.

Next, an inert gas such as argon (Ar) is introduced to produce an inert atmosphere in the chamber 2, the shaft 114 is rotated in a horizontal plane at a constant angular velocity about its axis, and with the outer crucible 11 being rotated at a constant angular velocity, the heater 104 is then activated, and the source material inside the outer crucible 11 heated to a temperature exceeding the single crystal growing temperature to melt the source material and form the semiconductor melt Sc2.

Once all the source material has melted to form the semiconductor melt Sc2, the inner crucible 12 is mounted on to the outer crucible 11 to form the double crucible 3. The electrical power to the heater 104 is then adjusted so as to maintain the surface temperature in the middle area of the semiconductor melt Sc2 at the single crystal growing temperature, and after the seed crystal Sc4, which is suspended from the pulling shaft 6a of the single crystal pulling device 6, is contacted with the semiconductor melt Sc2, the seed crystal Sc4 is pulled vertically upwards, and a single crystal of semiconductor Sc3 is grown around the nucleus of the seed crystal Sc4. Thus, following preparation of a seed crystal Sc4 which is free of dislocation, the diameter of the single crystal Sc3 is gradually increased to produce a single crystal semiconductor Sc3 of specified diameter.

With this single crystal growth process, first, the controllers 73, 75 of the source material supply device 70 are used to continuously supply the granulated semiconductor source material Sc1 from the granulated semiconductor source material storage supply device 72 to the hopper 76, in a quantity in accordance with the growth rate (pull rate) of the single crystal of semiconductor Sc3, and to intermittently supply suitable quantities of the dopant Sc12 from the dopant storage supply device 74 to the hopper 76. In so doing the granulated semiconductor source material Sc1 and the dopant Sc12 are mixed together, flow down the source material supply tube 80, and enter the outer crucible 11 at a point outside the inner crucible 12. This granulated semiconductor source material Sc1 melts in the outer crucible 11, outside the inner crucible 12, and is then supplied continuously to the inside of the inner crucible 12 by passage through the connecting apertures 13.

In this embodiment a flexible tube 83 is employed in one portion of the source material supply tube 80 which spans the distance between the storage supply device 71 which supplies the granulated semiconductor source material Sc1, and the double crucible 3, and so the flow time of the granulated semiconductor source material Sc1 from the storage supply device 71 to the double crucible 3, and the flow velocity with which it enters the double crucible 3 can be easily adjusted by moving the storage supply device 71 relative to the double crucible 3 and altering the height of the storage supply device 71 relative to the double crucible 3, as with the example shown by the phantom line (chain line) in FIG. 12. Furthermore, by slackening the lower portion of the flexible tube 83 of the source material supply tube 80, as shown by the phantom line in FIG. 12, the flow velocity of the granulated semiconductor source material Sc1 can be reduced rapidly in that lower portion, and so in comparison with currently employed apparatus (FIG. 21), the flow velocity of the semiconductor source material Sc1 can be reduced without decreasing the flow time.

Consequently, the supply of the semiconductor source material Sc1 can be accomplished without major rippling of the surface of the semiconductor melt Sc2 stored in the double crucible 3, and in comparison with current examples (FIG. 21), suitable quantities of the semiconductor source material Sc1 can be supplied with more appropriate timing in relation to the growth rate (pull rate) of the single crystal of semiconductor Sc3. Furthermore, the dopant Sc12 of the semiconductor source material Sc1 can also be supplied with more appropriate timing. Using the process outlined above, a single crystal of semiconductor Sc3 with high crystallinity can be formed.

Figure 13:
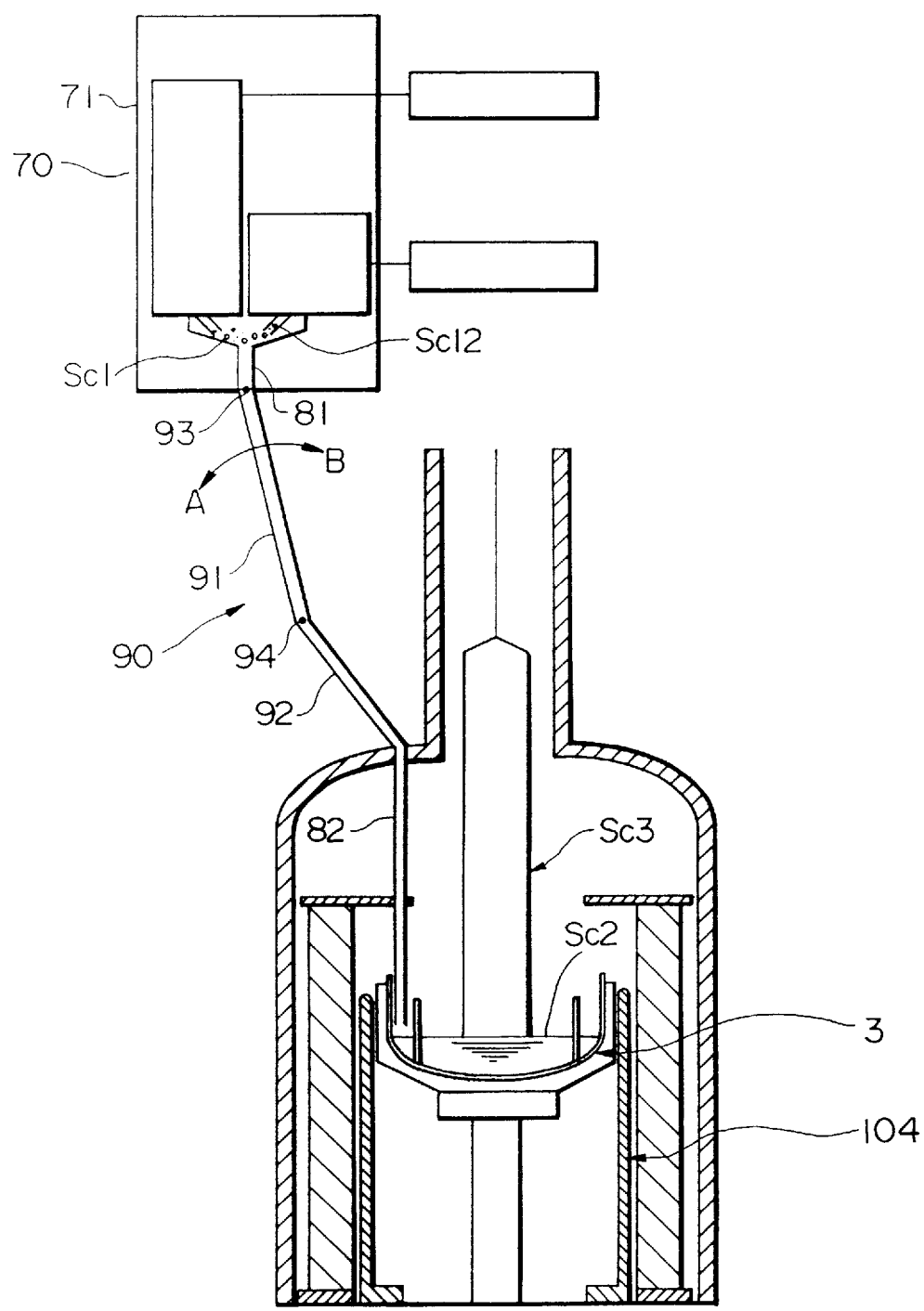
FIG. 13 is a diagram showing a seventh embodiment of a single crystal pulling apparatus of the present invention.

A seventh embodiment of the present invention is shown in FIG. 13. With this seventh embodiment, in place of the flexible tube 83 of the source material supply tube 80 of the sixth embodiment described above, a pair of rigid tubes 91, 92 which are joined together via a flexible connection, are positioned between the upper tube 81 and the lower tube 82, with one of the rigid tubes 91 being connected via a flexible connection to the upper tube 81, and the other rigid tube 92 being connected to the lower tube 82, as shown in FIG. 13. A bent section 93 is formed between the rigid tube 91 and the upper tube 81, and another bent section 94 formed between the two rigid tubes 91, 92. The bent sections 93, 94 are most suitably formed from flexible tubing such as Teflon tubing or nylon tubing. A configuration where the upper end of this flexible tubing is connected to the upper tube 81, the middle portion is inserted inside the rigid tubes 91, 92, and the lower end is connected to the lower tube 82, is also possible.

With the source material supply tube 90 of this configuration, using mainly the properties of the bent section 94, the storage supply device 71 can be rotated and moved relative to the double crucible 3, enabling alteration of the relative height of the storage supply device 71 above the double crucible 3, and so the flow time of the granulated semiconductor source material Sc1 from the storage supply device 71 to the double crucible 3, and the flow velocity with which it enters the double crucible 3 can be easily adjusted. Furthermore, by using the flexible section 94 of the source material supply tube 90 to ensure that the slope of the rigid tube 92 fitted below the flexible section 94 is less inclined than the slope of the rigid tube 91 fitted above the flexible section 94, the flow velocity of the semiconductor source material Sc1 in the lower rigid tube 92 can be lowered rapidly, and so in comparison with currently employed apparatus (FIG. 21), the flow velocity of the semiconductor source material Sc1 can be reduced without decreasing the flow time. Consequently, an equivalent result to that achieved by the embodiment of FIG. 12 can be achieved. Furthermore, because the flexible section 93 is fitted between the rigid tube 91 and the upper tube 81, the storage supply device 71 can be moved while keeping the device axis vertical. Furthermore, by providing a flexible section between the lower rigid tube 92 and the lower tube 82, and producing a configuration in which the slope of the lower rigid tube 92 is also freely adjustable, the flow velocity of the granulated semiconductor source material Sc1 can be adjusted even more easily and freely.

The granulated semiconductor source material Sc1 comprising granules of polysilicon may be substituted with Gallium Arsenide (GaAs). That is, a single crystal of gallium arsenide is pulled from a gallium arsenide melt, using gallium arsenide as the granulated source material In this case, elements such as zinc (Zn) or silicon (Si) are used as the dopant Sc12. Furthermore, the configurations described above employ a continuous supply of the granulated semiconductor source material Sc1, but configurations where the granulated semiconductor source material Sc1 is supplied intermittently are also possible. For example, replenishment of the granulated semiconductor source material Sc1 can be stalled until the melt level of the semiconductor melt Sc2 inside the double crucible 3 falls below a predetermined height, and then when the melt level of the semiconductor melt Sc2 falls below that predetermined lower limit, granulated, semiconductor source material Sc1 is added until the melt level of the semiconductor melt returns to a predetermined standard melt level.

Figure 14:
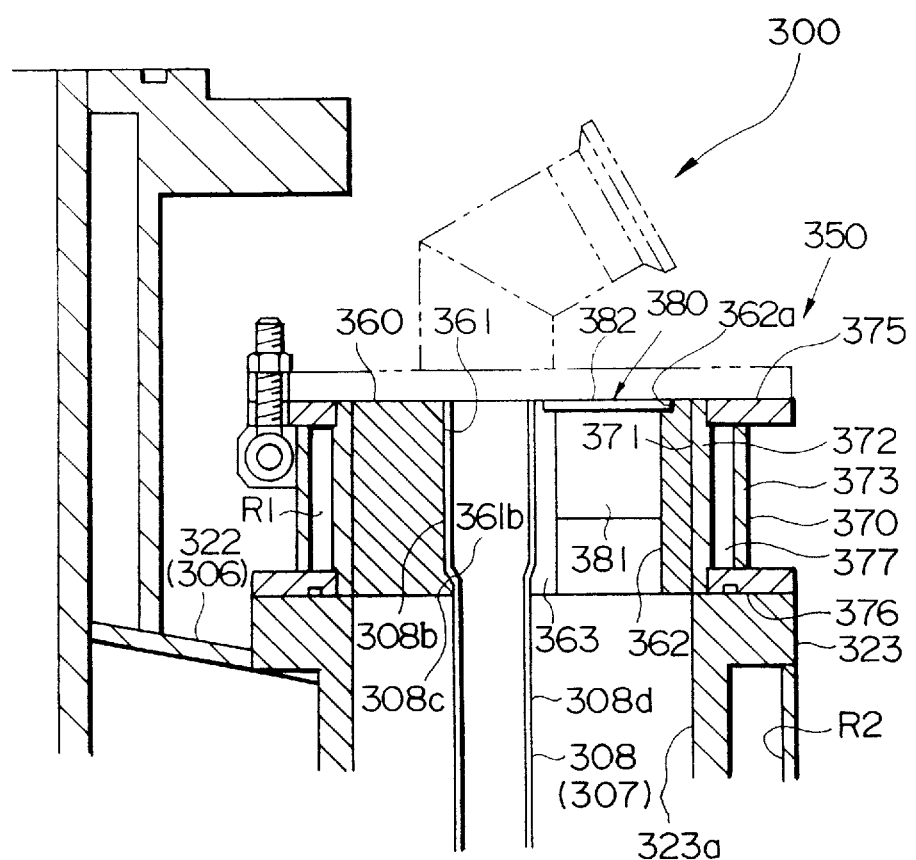
FIG. 14 is a front cross-sectional view of an embodiment of a supply tube stopping portion (supply tube stopping device) of an eighth embodiment of a single crystal pulling apparatus of the present invention.

A front face view of one embodiment of a supply tube stopping portion (supply tube stopping device) of an eighth embodiment of the present invention is shown in FIG. 14. A single crystal pulling apparatus 300 of this eighth embodiment comprises the currently employed single crystal pulling apparatus 1 shown in FIG. 23, in which the supply tube stopping device 225 has been improved and substituted with a supply tube stopping device 350 shown in FIG. 14, and in which the lid portion 222 of the chamber 206 shown in FIG. 22 and FIG. 23 and the corresponding supply tube insertion section 223 have been improved and replaced with a lid portion 322 of a chamber 306 and a supply tube insertion section 323 shown in FIG. 14 respectively. Consequently, parts which are the same for both the apparatus 1 and the apparatus 300 are denoted by the same numeral, and their description is omitted.

Figure 16:
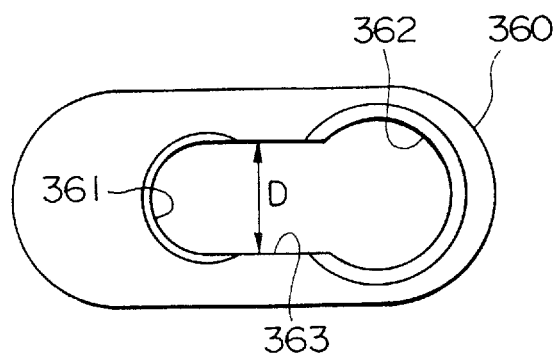
FIG. 16 is a plan view of the main body of FIG. 15.

The supply tube stopping device 350, as shown in FIG. 14, comprises a main body 360, of oval shape in external plan view as shown in FIG. 16, a main body support section 370 which contains a fitting aperture 371 into which the main body 360 fits, and a cap 380 which is fitted to the main body 360.

Figure 18:
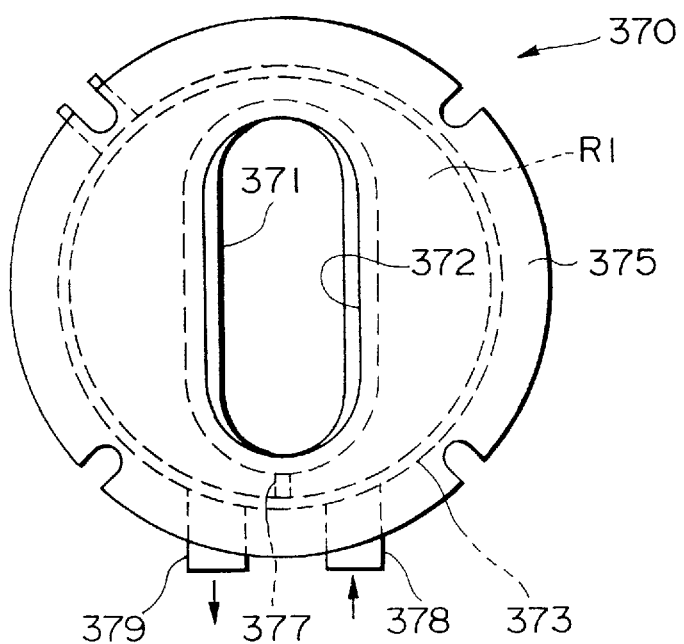
FIG. 18 is a plan view of the main body support section of FIG. 17.

The main body support section 370 comprises an inner cylinder 372, which forms the fitting aperture 371, and which has an oval shape in external plan view as shown in FIG. 18, an outer cylinder 373 which is positioned axially concentric with the inner cylinder 372, and which forms a coolant flow passage R1 around the inner cylinder 372, an annular upper plate 375 which closes off the upper end of the coolant flow passage R1 between the inner cylinder 372 and the outer cylinder 373, an annular lower plate 376 which closes off the lower end of the coolant flow passage R1 between the inner cylinder 372 and the outer cylinder 373 and which is bolted to the supply tube insertion section 323, a partition plate 377 which partitions the coolant flow passage R1 provided between the inner cylinder 372 and the outer cylinder 373, and as shown in FIG. 18, a coolant entry 378 where coolant such as ice water is introduced into the coolant flow passage R1, and a coolant exit 379 from where this ice water is expelled, which are provided on the outer cylinder 373 on either side of the partition plate 377.

Figure 17:
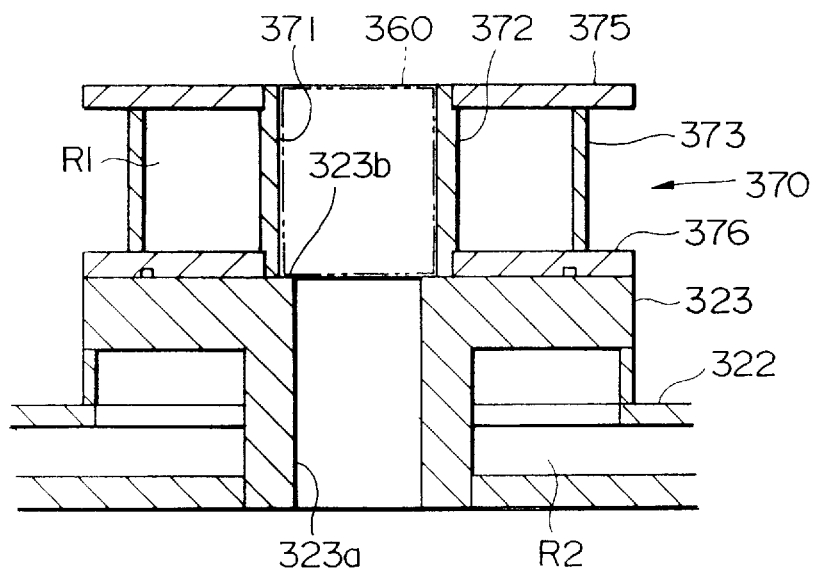
FIG. 17 is a side cross-sectional view of a main body support section of the supply tube stopping portion of FIG. 14.

Furthermore, with this embodiment, the lid portion 322 of the chamber 306 is a double plate type structure with a coolant flow passage R2 inside, as shown in FIG. 17, which is formed to circulate coolant around the supply tube inlet aperture 323a of the supply tube insertion section 323. The upper surface 323b of the supply tube insertion section 323 protrudes further inward than the fitting aperture 371, and so the main body 360 which is fitted inside the fitting aperture 371 is supported by the upper surface 323b.

Figure 15:
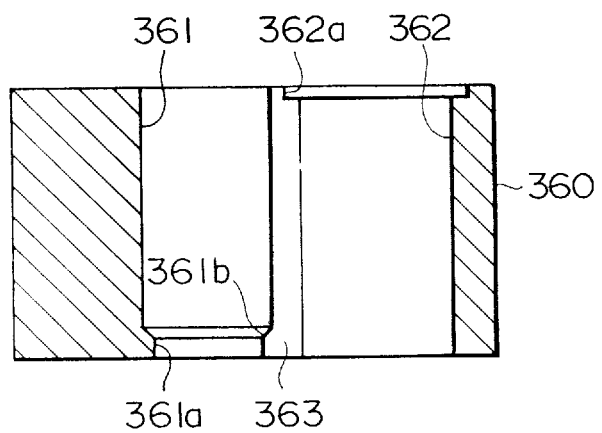
FIG. 15 is a front cross-sectional view of a main body of the supply tube stopping portion of FIG. 14.

The main body 360 contains an engagement aperture 361, which is situated towards one edge (namely, towards the left edge in FIG. 15) of the main body, and which passes through the main body from top to bottom. The engagement aperture 361 is circular in plan view, as shown in FIG. 16. As shown in FIG. 15, the lower portion 361a of the aperture wall of the engagement aperture 361 has a narrower diameter, and an engagement surface 361b is thus provided on the upper edge of the resultant tapered portion. As shown in FIG. 14, the upper portion 308b of the internal tube 308 is inserted and fitted into the engagement aperture 361, and the engagement surface 308c of the upper portion 308b becomes mounted on the engagement surface 361a on the aperture wall of the engagement aperture 361, and is thus stoppingly engaged.

Furthermore, as shown in FIG. 15, the main body 360 also contains an insertion aperture 362, which is situated towards the other edge (namely, towards the right edge in FIG. 15) of the main body, and which passes through the main body from top to bottom. This insertion aperture 362 is circular in plan view, as shown in FIG. 16, and has a diameter which is larger than that of the external surface of the upper portion 308b of the internal tube 308, so that the upper portion 308b can be inserted into the insertion aperture 362 from the bottom and projected out through the top. Furthermore, the upper edge of the aperture wall of the insertion aperture 362 contains a circular recess portion.

In addition, the main body 360 contains a connection aperture 363 which joins the insertion aperture 362 and the engagement aperture 361 from top to bottom (namely, in a direction perpendicular to the page in FIG. 16), as shown in FIG. 16. A width D of this connection aperture 363 is narrower than the external surface of the upper portion 308b of the internal tube 308 of FIG. 14, but wider than the external surface of the middle portion 308d of the internal tube 308 which is directly below the upper portion 308b.

The cap 380 comprises a cylindrical portion 381 which fits in the insertion aperture 362, and a circular plate portion 382, which is fixed to the upper end of the cylindrical portion 381, and the outside edge of which is fitted into the recess portion 362a.

Figure 23:
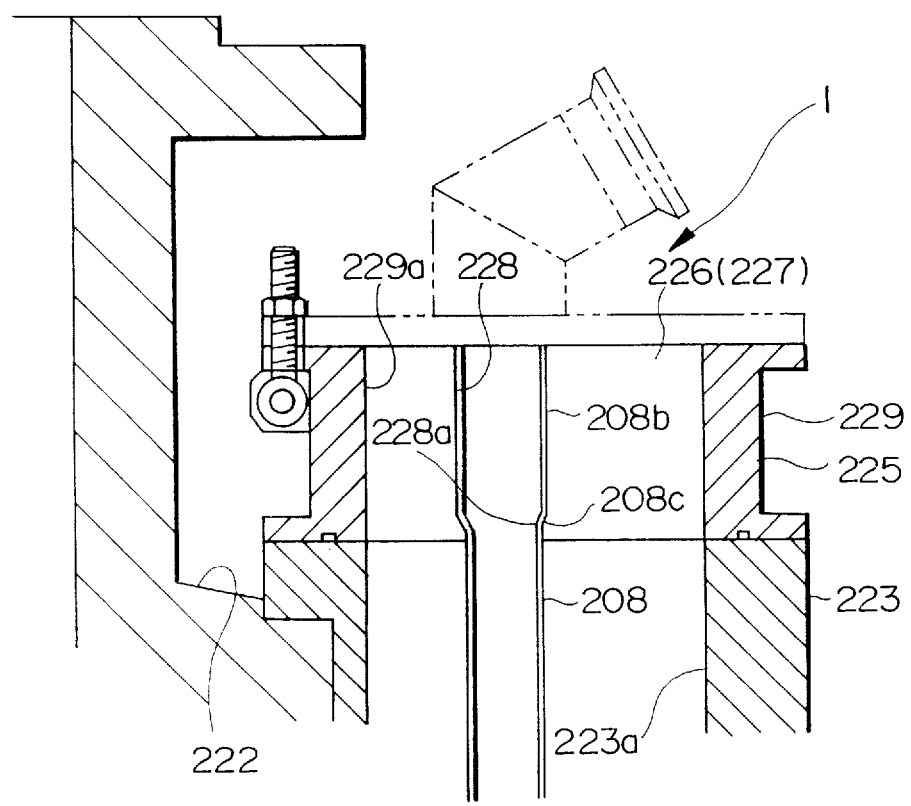
FIG. 23 is a diagram showing an example of a supply tube stopping portion of FIG. 22.
Figure 24:
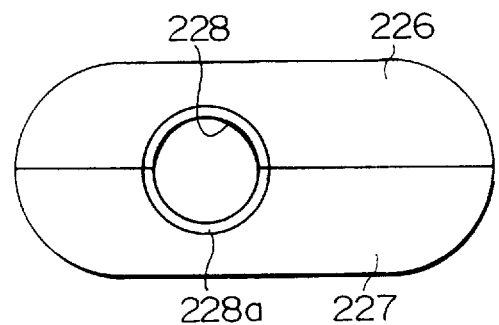
FIG. 24 is a plan view of a split mold for the supply tube stopping portion of FIG. 23.
Figure 25:
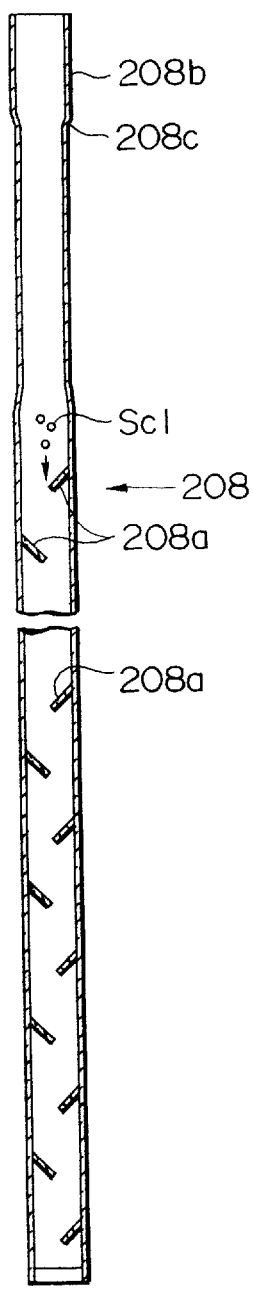
FIG. 25 is a side view showing an example of an internal tube of the source material supply tube.

The single crystal pulling apparatus 300 includes the configurations outlined above, and so to position and install the internal tube 308 of the source material supply tube 307 inside the chamber 306, the upper portion 308b of the internal tube 308 is passed through the insertion aperture 362 of the main body 360 of the supply tube stopping device 350 which is fitted to the supply tube insertion section 323 of the lid portion 322, and the upper portion 308b of the internal tube 308 pushed upwards into the main body 360, as shown in FIG. 14. In so doing, the middle portion 308d of the internal tube 308, which lies directly below the upper portion 308b and which has a narrower diameter, is positioned in the insertion aperture 362. This middle portion 308d has a narrower diameter than the upper portion 308b, and can therefore slide back and forth through the connection aperture 363. At this point, the internal tube 308 is moved horizontally through the connection aperture 363 into the engagement aperture 361, and the internal tube 308 then lowered, thus fitting the upper portion 308b of the internal tube 308 into the engagement aperture 361, and mounting and engaging the engagement surface 308c on the outer surface of the upper portion 308b, on to the engagement surface 361b of the engagement aperture 361. The cap 380 is then fitted into the now empty insertion aperture 362, preventing movement of the internal tube 308 back into the insertion aperture 362. In this way, the internal tube 308 can be installed. The lid portion 322 is then closed, and the internal tube 308 inserted into the guide 231 (see FIG. 22), thus positioning it inside the main vessel (not shown in the figures) of the chamber 306. Consequently, this embodiment is able to eliminate the intricate and complex tasks of fitting the two pieces of the split mold 226,227 together to form the engagement aperture 228, and then fitting the closed mold into the fitting aperture 229a of the split mold support section 229, which are required in current configurations such as those in FIG. 23 and FIG. 24, and so the installation of the internal tube 308 can be completed simply and rapidly.

Furthermore, as shown in FIG. 14, since the main body 360 can be moved upwards and freely withdrawn from the fitting aperture 371 of the main body support section 370, then an alternative process can involve withdrawing the main body 360, passing the upper portion 308b of the internal tube 308 through the fitting aperture 371 and pushing it up into the main body support section 370, and at this point, fitting the insertion aperture 362 of the main body 360 over the upper portion 308b of the internal tube 308, moving the internal tube through the connection aperture 363 into the engagement aperture 361, and then fitting the main body 360, together with the upper portion 308b of the internal tube 308, into the fitting aperture 371 of the main body support section 370.

Figure 22:
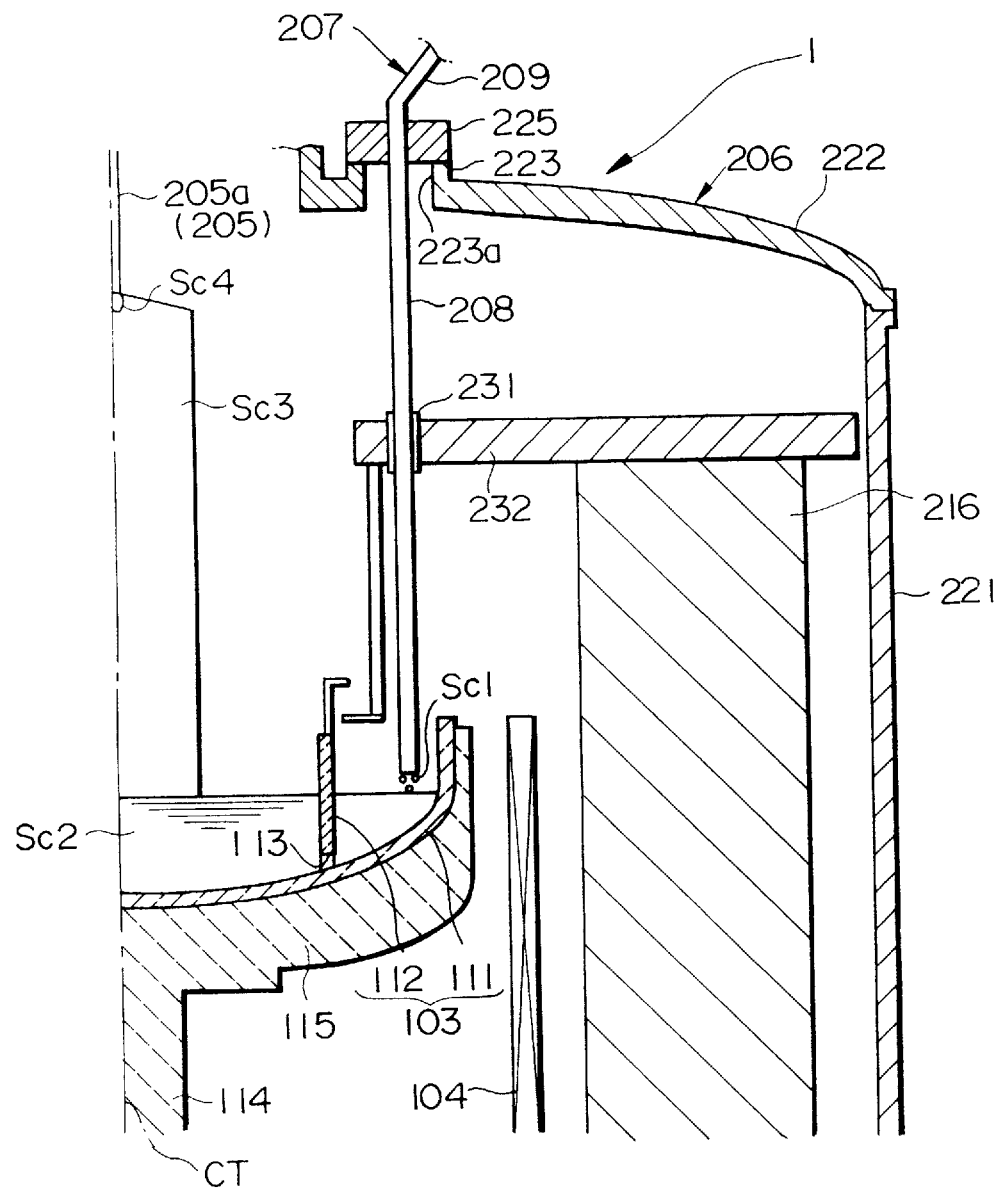
FIG. 22 is a schematic diagram showing a single crystal pulling apparatus which incorporates a currently employed supply tube stopping portion.

In those instances where the double crucible 103 shown in FIG. 22 is exchanged for another such crucible of even larger diameter, then by altering the position of the guide 231 to a position further removed from the axis CT, the position of the lower end of the internal tube 308 can be easily moved away from the axis CT to accommodate the exchanged double crucible 103 (refer to FIG. 22), as described below. Namely, first the main body 360 of FIG. 14 is moved upwards and withdrawn from the fitting aperture 371 of the main body support section 370, and the main body 360 rotated 180° in the horizontal plane. Because the main body 360 is oval in shape, rotation of the main body 360 by 180° in the horizontal plane causes no change in the outward appearance. Consequently, it can be fitted back into the fitting aperture 371 in this rotated state. In so doing, the engagement aperture 361 of the main body 360 moves to a position further away from the axis CT mentioned above, and if the upper portion 308b of the internal tube 308 is fitted and engaged in the engagement aperture 361, the position of the internal tube 308 is moved very simply, to a position more distant from the axis CT. Furthermore, the opposite operation of bringing the position of the inner tube 308 closer to the axis CT can also be performed simply. Consequently, the internal tube 308 can be positioned and installed in the most suitable position far more easily than in current configurations, and so the exchange of the double crucible 103 (refer to FIG. 22) can be completed easily.

Furthermore, during the growing of the single crystal of semiconductor Sc3, ice water is injected into the coolant entry 378 of the main body support section 370 shown in FIG. 18, circulates round the coolant flow passage R1 surrounding the fitting aperture 371, and exits from the coolant exit 379. This ice water prevents overheating of the upper portion 308b of the internal tube 308, which as shown in FIG. 14, passes through the main body fitted in the fitting aperture 371, and is fitted and engaged in the engagement aperture 361 of the main body 360. Consequently, deterioration of the internal tube 308 can be prevented, and the usable life of the tube extended. Furthermore, by passing ice water through the lid portion 322 and the coolant flow passage R2 of the supply tube insertion section 323, it is possible to prevent the overheating of the lid portion 322 and the supply tube insertion section 323, thus allowing prevention of the deterioration of the lid portion 322 and the supply tube insertion section 323, and extending their usable lives.

In the eighth embodiment, a supply tube stopping device 350, wherein the main body 360 and the main body support section 370 can be freely detached, is fitted as a supply tube stopping portion. However, the invention also includes embodiments in which the supply tube stopping device 350 includes a main body 360 and main body support section 370 which are integrated into a single body, as well as being integrated into the supply tube insertion section 323 of the lid portion 322.

Figure 26:
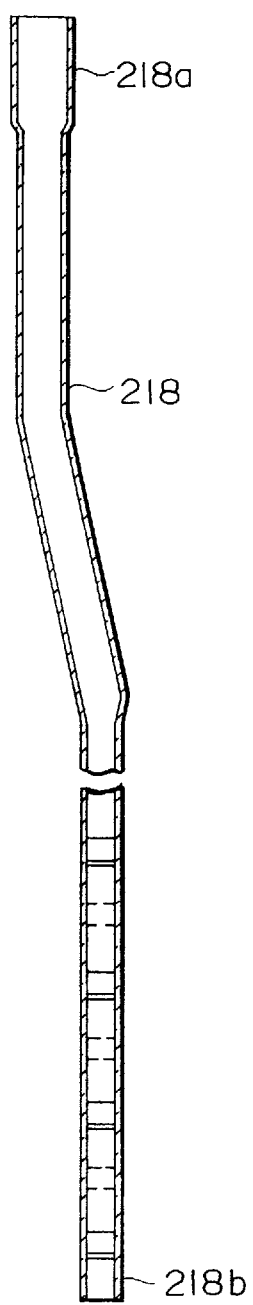
FIG. 26 is a front view showing a further example of an internal tube of the source material supply tube.

Furthermore, if a configuration is employed in which the external plan view of the main body 360 and the fitting aperture 371 are both circular, then the main body 360 can be rotated freely in relation to the fitting aperture 371, and so the position of the engagement aperture 361 of the main body 360 can be adjusted and moved continuously from the center of the double crucible 103 (refer to FIG. 22) out to the edges of the crucible. In those instances where the position of the aperture is outside the adjustment distance, an internal tube like that shown in FIG. 26, in which the engagement portion 218a is offset from the axis of the supply portion 218b, may be used.

In embodiments six, seven and eight described above, the configuration of the baffle plates (not shown in the figures) inside the source material supply tubes is the same as the configuration for the first embodiment. Moreover, the structure of the inclined portion at the lower end of the source material supply tube is the same as that described for the first five embodiments.

Finally, the present application claims the priority of Japanese Patent Application No. Hei-7-344174 filed Dec. 28, 1995, No. Hei-8-001837 filed Jan. 9, 1996, No. Hei-8-003376 filed Jan. 11, 1996, No. Hei-8-004405 filed Jan. 12, 1996, which is herein incorporated by reference.

What is claimed is:

1. A single crystal pulling apparatus comprising:
    a gas tight container;
    a crucible inside said gas tight container for retaining semiconductor melt;
    a source material supply tube suspended from an upper portion of said gas tight container having a lower opening positioned to allow granulated source material to be added to said semiconductor melt retained in said crucible; and
    an inclined portion, provided at a slope relative to a horizontal plane at a lower portion of said source material supply tube, for ensuring that said source material exiting from said lower opening of said material supply tube drops into said semiconductor melt in proximity to a side wall of said crucible.

2. A single crystal pulling apparatus according to claim 1, wherein said crucible includes an outer crucible and an inner crucible communicating with each other and said inclined portion of said source material supply tube introduces said source material exiting from said lower opening of said source material supply tube to the semiconductor melt by directing said source material to an area between said outer crucible and said inner crucible and in proximity to a side wall of said outer crucible.

3. A single crystal pulling apparatus according to claim 2, wherein said source material supply tube is positioned so that two longer side walls of a transverse cross section of said source material supply tube are facing said inner crucible and said outer crucible respectively.

4. A single crystal pulling apparatus comprising:
    a gas tight container;
    an outer crucible inside said gas tight container;
    an inner crucible inside said gas tight container and communicating with said outer crucible;
    a source material supply tube suspended from an upper portion of said gas tight container having a lower opening positioned to allow granulated source material to exit said supply tube and be added to semiconductor melt retained in an area between said inner crucible and said outer crucible; and
    an inclined portion, provided at a slope relative to a horizontal plane at a at a lower end of said source material supply tube, for ensuring that said source material exiting from said lower opening of said material supply tube drops into said semiconductor melt in proximity to a side wall of said inner crucible.

5. A single crystal pulling apparatus comprising:
    a gas tight container;
    an outer crucible inside said gas tight container;
    an inner crucible inside said gas tight container and communicating with said outer crucible; and
    a source material supply tube, suspended from an upper portion of said gas tight container and having a lower opening positioned to permit granulated source material to exit said material supply tube and be added to semiconductor melt retained in an area between said inner crucible and said outer crucible, said source material supply tube having
        two longer side walls of a transverse cross section of said source material supply tube that face said inner crucible and said outer crucible, respectively,
        a plurality of baffle plates fitted alternately down two inner walls corresponding to two shorter sides of the transverse cross section for reducing the drop velocity of said source material as it exits said material supply tube; and
        an inclined portion, provided at a slope relative to a horizontal plane at a at a lower end of said source material supply tube, for ensuring that said source material exiting from said lower opening of said material supply tube drops into said semiconductor melt in proximity to a side wall of said inner crucible.

6. A single crystal pulling apparatus comprising:
    a gas tight container;
    an outer crucible inside said gas tight container;
    an inner crucible inside said gas tight container and communicating with said outer crucible;
    a source material supply tube suspended from an upper portion of said gas tight container and having a lower opening positioned to allow granulated source material to exit said supply tube and be added to semiconductor melt retained in an area between said inner crucible and said outer crucible; and
    an inclined portion, provided at a slope relative to a horizontal plane at a lower end of said source material supply tube, for ensuring that said source material exiting from said lower opening of said material supply tube drops into said semiconductor melt in proximity to a side wall of said inner crucible, wherein said inclined portion serves as a scattering means, for applying a horizontal component of force to said source material exiting from said lower opening of said material supply tube, in order to scatter the source material over the surface of said semiconductor melt.

7. A single crystal pulling apparatus comprising:
    a gas tight container;
    an outer crucible inside said gas tight container;
    an inner crucible inside said gas tight container and communicating with said outer crucible;
    a source material supply tube suspended from an upper portion of said gas tight container having a lower opening positioned to allow granulated source material to exit said supply tube and be added to semiconductor melt retained in an area between said inner crucible and said outer crucible; and
    an inclined portion, provided at a slope relative to a horizontal plane at a lower end of said source material supply tube, for ensuring that said source material exiting from said lower opening of said material supply tube drops into said semiconductor melt in proximity to a side wall of said inner crucible, wherein said inclined portion serves as a source material scattering means by applying a horizontal component of force to said source material exiting from a lower opening of said material supply tube in order to scatter the source material over the surface of said semiconductor melt, said source material scattering means including a capture plate, provided beneath said lower opening of said source material supply tube, for catching said source material exiting from said lower opening, and a space, maintained between said lower opening of said source material supply tube and capture plate, for ensuring that said source material falls outside the edges of said capture plate and exits through said lower opening.

8. A single crystal pulling apparatus comprising:

a gas tight container;

an outer crucible inside said gas tight container;

an inner crucible inside said gas tight container and communicating with said outer crucible;

a source material supply tube suspended from an upper portion of said gas tight container having a lower opening positioned to allow granulated source material to exit said supply tube and be added to semiconductor melt retained in an area between said inner crucible and said outer crucible; and an inclined portion, provided at a slope relative to a horizontal plane at a lower end of said source material supply tube, for ensuring that said source material exiting from said lower opening of said material supply tube drops into said semiconductor melt in proximity to a side wall of said inner crucible, wherein said inclined portion serves as a source material scattering means by applying a horizontal component of force to said source material exiting from said lower opening of said material supply tube in order to scatter the source material over the surface of said semiconductor melt, said source material scattering means including a capture plate, provided beneath said lower opening of said source material supply tube, for catching said source material exiting from said lower opening, said capture plate being inclined downwards in at least one of a direction of rotation of said double crucible and a direction towards external wall of outside crucible, wherein there is a space between said lower opening of said source material supply tube and said capture plate for ensuring that said source material falls outside the edges of said capture plate and exits through said lower opening.

9. A single crystal pulling apparatus comprising:

a gas tight container;

an outer crucible inside said gas tight container;

an inner crucible inside said gas tight container and communicating with said outer crucible;

a source material supply tube suspended from an upper portion of said gas tight container having a lower opening positioned to allow granulated source material to exit said supply tube and be added to semiconductor melt retained in an area between said inner crucible and said outer crucible; and an inclined portion, provided at a slope relative to a horizontal plane at a lower end of said source material supply tube, for ensuring that said source material exiting from said lower opening of said material supply tube drops into said semiconductor melt in proximity to a side wall of said inner crucible, wherein said inclined portion serves as a source material scattering means by applying a horizontal component of force to said source material exiting from said lower opening of said material supply tube in order to scatter the source material over the surface of said semiconductor melt, said source material scattering means including a capture plate, provided beneath said lower opening of said source material supply tube and supported by a stay provided on a tip end of said source material supply tube, for catching said source material exiting from lower opening, wherein there is a space between said lower opening of said source material supply tube and said capture plate for ensuring that said source material falls outside the edges of said capture plate and exits through said lower opening.

10. A single crystal pulling apparatus comprising:

a gas tight container;

an outer crucible inside said gas tight container;

an inner crucible inside said gas tight container and communicating with said outer crucible;

a source material supply tube suspended from an upper portion of said gas tight container having a lower opening positioned to allow granulated source material to exit said supply tube and be added to semiconductor melt retained in an area between said inner crucible and said outer crucible; and an inclined portion, provided at a slope relative to a horizontal plane at a lower end of said source material supply tube, for ensuring that said source material exiting from said lower opening of said material supply tube drops into said semiconductor melt in proximity to a side wall of said inner crucible, wherein said inclined portion serves as a source material scattering means by applying a horizontal component of force to said source material exiting from said lower opening of said material supply tube in order to scatter the source material over the surface of said semiconductor melt, said source material scattering means including a capture plate, provided beneath said lower opening of said source material supply tube and supported by a stay provided on a tip end of said source material supply tube for catching said source material exiting from said lower opening, said capture plate being inclined downwards in at least one of a direction of rotation of said double crucible and a direction towards external wall of outside crucible, and wherein there is a space between said lower opening of said source material supply tube and said capture plate for ensuring that said source material falls outside the edges of said capture plate and exits through said lower opening.

11. A single crystal pulling apparatus comprising:

a gas tight container;

an outer crucible inside said gas tight container;

an inner crucible inside said gas tight container and communicating with said outer crucible;

a source material supply tube suspended from an upper portion of said gas tight container having a lower opening positioned to allow granulated source material to exit said supply tube and be added to semiconductor melt retained in an area between said inner crucible and said outer crucible; and an inclined portion, provided at a slope relative to a horizontal plane at a lower end of said source material supply tube, for ensuring that said source material exiting from said lower opening of said material supply tube drops into said semiconductor melt in proximity to a side wall of said inner crucible, wherein said inclined portion serves as a source material scattering means by applying a horizontal component of force to said source material exiting from said lower opening of said material supply tube in order to scatter the source material over the surface of said semiconductor melt, said source material scattering means including a capture plate, provided beneath said lower opening of said source material supply tube and supported by a support member separate from said source material supply tube, for catching said source material exiting from lower opening, and wherein there is a space between said lower opening of said source material supply tube and said capture plate for ensuring that said source material falls outside the edges of said capture plate and exits through said lower opening.

12. A single crystal pulling apparatus comprising:

a gas tight container;

an outer crucible inside said gas tight container;

an inner crucible inside said gas tight container and communicating with said outer crucible;

a source material supply tube suspended from an upper portion of said gas tight container having a lower opening positioned to allow granulated source material to exit said supply tube and be added to semiconductor melt retained in an area between said inner crucible and said outer crucible; and an inclined portion, provided at a slope relative to a horizontal plane at a lower end of said source material supply tube, for ensuring that said source material exiting from said lower opening of said material supply tube drops into said semiconductor melt in proximity to a side wall of said inner crucible, wherein said inclined portion serves as a source material scattering means by applying a horizontal component of force to said source material exiting from said lower opening of said material supply tube in order to scatter the source material over the surface of said semiconductor melt, said source material scattering means including a capture plate, provided beneath said lower opening of said source material supply tube and supported by a support member separate from said source material supply tube, for catching said source material exiting from said lower opening, said capture plate being inclined downwards in at least one of a direction of rotation of said double crucible and a direction towards external wall of outside crucible, and wherein there is a space between said lower opening of said source material supply tube and said capture plate for ensuring that said source material falls outside the edges of said capture plate and exits through said lower opening.

13. A single crystal pulling apparatus comprising:

a gas tight container;

an outer crucible inside said gas tight container;

an inner crucible inside said gas tight container and communicating with said outer crucible;

a source material supply tube suspended from an upper portion of said gas tight container having a lower opening positioned to allow granulated source material to exit said supply tube and be added to semiconductor melt retained in an area between said inner crucible and said outer crucible; and an inclined portion, provided at a slope relative to a horizontal plane at a lower end of said source material supply tube, for ensuring that said source material exiting from said lower opening of said material supply tube drops into said semiconductor melt in proximity to a side wall of said inner crucible, wherein said inclined portion serves as a scattering means, for applying a horizontal component of force to said source material exiting from said lower opening of said material supply tube, in order to scatter the source material over the surface of said semiconductor melt, said source material scattering means including a curved portion, provided at a lower end of said source material supply tube, formed by curving said source material supply tube towards a horizontal direction, wherein said lower opening of said source material supply tube is positioned at the end of said curved portion and facing a direction of inner and outer crucible rotation.

14. A single crystal pulling apparatus comprising:

a gas tight container;

an outer crucible inside said gas tight container;

an inner crucible inside said gas tight container and communicating with said outer crucible;

a source material supply tube suspended from an upper portion of said gas tight container having a lower opening positioned to allow granulated source material to exit said supply tube and be added to semiconductor melt retained in an area between said inner crucible and said outer crucible; and an inclined portion, provided at a slope relative to a horizontal plane at a lower end of said source material supply tube, for ensuring that said source material exiting from said lower opening of said material supply tube drops into said semiconductor melt in proximity to a side wall of said inner crucible, wherein said inclined portion serves as a scattering means, for applying a horizontal component of force to said source material exiting from said lower opening of said material supply tube, in order to scatter the source material over the surface of said semiconductor melt, said source material scattering means including an inclined wall, provided at an upper edge of an outer wall of said outer crucible and sloping downwards toward said outer crucible, wherein said lower opening of said source material supply tube is positioned above said inclined wall.

15. A single crystal pulling apparatus comprising:

a gas tight container with a lid portion;

a crucible inside said gas tight container for retaining semiconductor melt;

a source material supply tube passing through said lid portion of said gas tight container and having a lower opening positioned to allow granulated source material to be added to said semiconductor melt retained in said crucible;

an internal tube, inserted within said source material supply tube, positioned inside said gas tight container, and stoppingly engaged by an engagement surface at a lower end portion of an outer surface of an upper wide diameter portion; and supply tube insertion section, for inserting said internal tube, formed within said lid portion and having an engagement aperture through which said internal tube is inserted and an engagement aperture wall with a supply tube stopping portion, formed by an upward facing engagement surface, for stoppingly engaging internal tube, said supply tube stopping portion having an insertion aperture, positioned adjacent to said engagement aperture, for inserting upper end portion of said internal tube, and a connection aperture, located between said insertion aperture and said engagement aperture, for passing said internal tube from said insertion aperture to said engagement aperture.

16. A single crystal pulling apparatus comprising:

a gas tight container with a lid portion;

a crucible inside said gas tight container for retaining semiconductor melt;

a source material supply tube passing through said lid portion of said gas tight container and having a lower opening positioned to allow granulated source material to be added to said semiconductor melt retained in said crucible;

an internal tube, inserted within said source material supply tube, positioned inside said gas tight container, and stoppingly engaged by an engagement surface at a lower end portion of an outer surface of an upper wide diameter portion; and supply tube insertion section, for inserting said internal tube, formed within said lid portion and having an engagement aperture through which said internal tube is inserted and an engagement aperture wall with a supply tube stopping portion, formed by an upward facing engagement surface, said supply tube stopping portion including a main body having an engagement aperture, an insertion aperture, positioned adjacent to said engagement aperture for inserting upper end portion of said internal tube, a connection aperture, located between said insertion aperture and said engagement aperture, for passing said internal tube from said insertion aperture to said engagement aperture, and a main body support section, for engaging and supporting said main body, wherein said main body and main body support section are formed in a shape such that said main body can be fitted with the location of said engagement aperture in two or more configurations with respect to said main body support section.

17. A single crystal pulling apparatus comprising:

a gas tight container with a lid portion;

a crucible inside said gas tight container for retaining semiconductor melt;

a source material supply tube passing through said lid portion of said gas tight container and having a lower opening positioned to allow granulated source material to be added to said semiconductor melt retained in said crucible;

an internal tube, inserted within said source material supply tube, positioned inside said gas tight container, and stoppingly engaged by an engagement surface at a lower end portion of an outer surface of an upper wide diameter portion; and supply tube insertion section, for inserting said internal tube, formed within said lid portion and having an engagement aperture through which said internal tube is inserted and an engagement aperture wall with a supply tube stopping portion, formed with a coolant flow passage for the flow of coolant, said supply tube stopping portion having an insertion aperture, positioned adjacent to said engagement aperture, for inserting upper end portion of said internal tube, and a connection aperture, located between said insertion aperture and said engagement aperture, for passing said internal tube from said insertion aperture to said engagement aperture.

18. A single crystal pulling apparatus comprising:

a gas tight container with a lid portion;

a crucible inside said gas tight container for retaining semiconductor melt;

a source material supply tube passing through said lid portion of said gas tight container and having a lower opening positioned to allow granulated source material to be added to said semiconductor melt retained in said crucible;

an internal tube, inserted within said source material supply tube, positioned inside said gas tight container, and stoppingly engaged by an engagement surface at a lower end portion of an outer surface of an upper wide diameter portion; and supply tube insertion section, for inserting said internal tube, formed within said lid portion and having an engagement aperture through which said internal tube is inserted and an engagement aperture wall with a supply tube stopping portion, said supply tube stopping portion formed with a coolant flow passage to accommodate the flow of coolant and includes a main body having an engagement aperture, an insertion aperture, positioned adjacent to said engagement aperture, for inserting upper end portion of said internal tube, a connection aperture, located between said insertion aperture and said engagement aperture, for passing said internal tube from said insertion aperture to said engagement aperture, and a main body support section, for engaging and supporting said main body, wherein said main body and main body support section are formed in a shape such that said main body can be fitted with the location of said engagement aperture in two or more configurations with respect to said main body support section.

* * * * *